US009934962B2

United States Patent
Hashimoto et al.

(10) Patent No.: US 9,934,962 B2
(45) Date of Patent: Apr. 3, 2018

(54) METHOD OF MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Yoshitomo Hashimoto, Toyama (JP); Yoshiro Hirose, Toyama (JP); Tatsuru Matsuoka, Toyama (JP)

(73) Assignee: HITACHI KOKUSAI ELECTRIC INC., Tokyo (JP)

(*) Notice: Subject to any disclaimer, the term of this patent is extended or adjusted under 35 U.S.C. 154(b) by 0 days.

(21) Appl. No.: 15/223,288

(22) Filed: Jul. 29, 2016

(65) Prior Publication Data

US 2017/0040157 A1 Feb. 9, 2017

(30) Foreign Application Priority Data

Aug. 5, 2015 (JP) .................. 2015-155526

(51) Int. Cl.
| H01L 21/314 | (2006.01) |
| C23C 16/455 | (2006.01) |
| H01L 21/02 | (2006.01) |

(52) U.S. Cl.
CPC .... *H01L 21/0228* (2013.01); *C23C 16/45527* (2013.01); *C23C 16/45534* (2013.01); *C23C 16/45546* (2013.01); *H01L 21/02126* (2013.01)

(58) Field of Classification Search
None
See application file for complete search history.

(56) References Cited

U.S. PATENT DOCUMENTS

| 2012/0329286 A1 | 12/2012 | Takeda et al. |
| 2013/0149873 A1* | 6/2013 | Hirose ................ H01L 21/31 438/763 |
| 2013/0252437 A1* | 9/2013 | Sano ................ H01L 21/02247 438/769 |

(Continued)

FOREIGN PATENT DOCUMENTS

| JP | 2012-015344 A | 1/2012 |
| JP | 2013-030752 A | 2/2013 |
| JP | 2013-140944 A | 7/2013 |

(Continued)

OTHER PUBLICATIONS

Office Action in KR counterpart Application No. 10-2016-0098104 dated Sep. 18, 2017.

*Primary Examiner* — Seahvosh Nikmanesh
*Assistant Examiner* — Xiaoming Liu
(74) *Attorney, Agent, or Firm* — Volpe and Koenig, P.C.

(57) ABSTRACT

A method of manufacturing a semiconductor device includes a process of forming a film on a substrate by performing a cycle a predetermined number of times. The cycle includes: supplying a precursor containing a predetermined element to the substrate; supplying a first reactant containing nitrogen and carbon to the substrate; supplying a second reactant containing nitrogen to the substrate; and supplying a third reactant containing oxygen to the substrate, wherein in the cycle, a supply amount of the second reactant is set to be smaller than a supply amount of the first reactant.

21 Claims, 9 Drawing Sheets

(56) References Cited

U.S. PATENT DOCUMENTS

2014/0235067 A1 8/2014 Shimamoto et al.
2014/0242809 A1 8/2014 Hashimoto et al.

FOREIGN PATENT DOCUMENTS

| JP | 2014-165395 A | 9/2014 |
|---|---|---|
| KR | 1020140066216 | 5/2014 |
| WO | 2013/054655 A1 | 4/2013 |

* cited by examiner

FIG. 6

| | Sample 1 | Sample 2 | Sample 3 | Sample 4 |
|---|---|---|---|---|
| $NH_3$ gas supply time (seconds) | 0 | 1 | 3 | 5 |
| Film thickness map | | | | |
| Average film thickness (Å) | 114.9 | 111.9 | 110.9 | 113.2 |
| WiW (%) | 1.32 | 1.17 | 0.96 | 0.67 |
| Refractive index map | | | | |
| Refractive index | 1.61 | 1.61 | 1.60 | 1.60 |
| Permittivity | 4.4 | 4.4 | 4.4 | 4.4 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is based upon and claims the benefit of priority from Japanese Patent Application No. 2015-155526, filed on Aug. 5, 2015, the entire contents of which are incorporated herein by reference.

TECHNICAL FIELD

The present disclosure relates to a method of manufacturing a semiconductor device, a substrate processing apparatus, and a recording medium.

BACKGROUND

A process of forming a multi-component film containing a predetermined element such as silicon (Si) or the like, oxygen (O), carbon (c), and nitrogen (N) on a substrate may be performed as a part of the processes of manufacturing a semiconductor device.

SUMMARY

The present disclosure provides some embodiments of a technique capable of enhancing the controllability of a composition ratio of a film formed on a substrate.

According to one embodiment of the present disclosure, there is provided a technique of manufacturing a semiconductor device including a process of forming a film on a substrate by performing a cycle a predetermined number of times, the cycle including: supplying a precursor containing a predetermined element to the substrate; supplying a first reactant containing nitrogen and carbon to the substrate; supplying a second reactant containing nitrogen to the substrate; and supplying a third reactant containing oxygen to the substrate, wherein in the cycle, a supply amount of the second reactant is set to be smaller than a supply amount of the first reactant.

BRIEF DESCRIPTION OF THE DRAWINGS

FIG. 6 is a diagram illustrating the evaluation results of a film thickness of a film formed on a substrate.

DETAILED DESCRIPTION

One Embodiment

Figure 1:
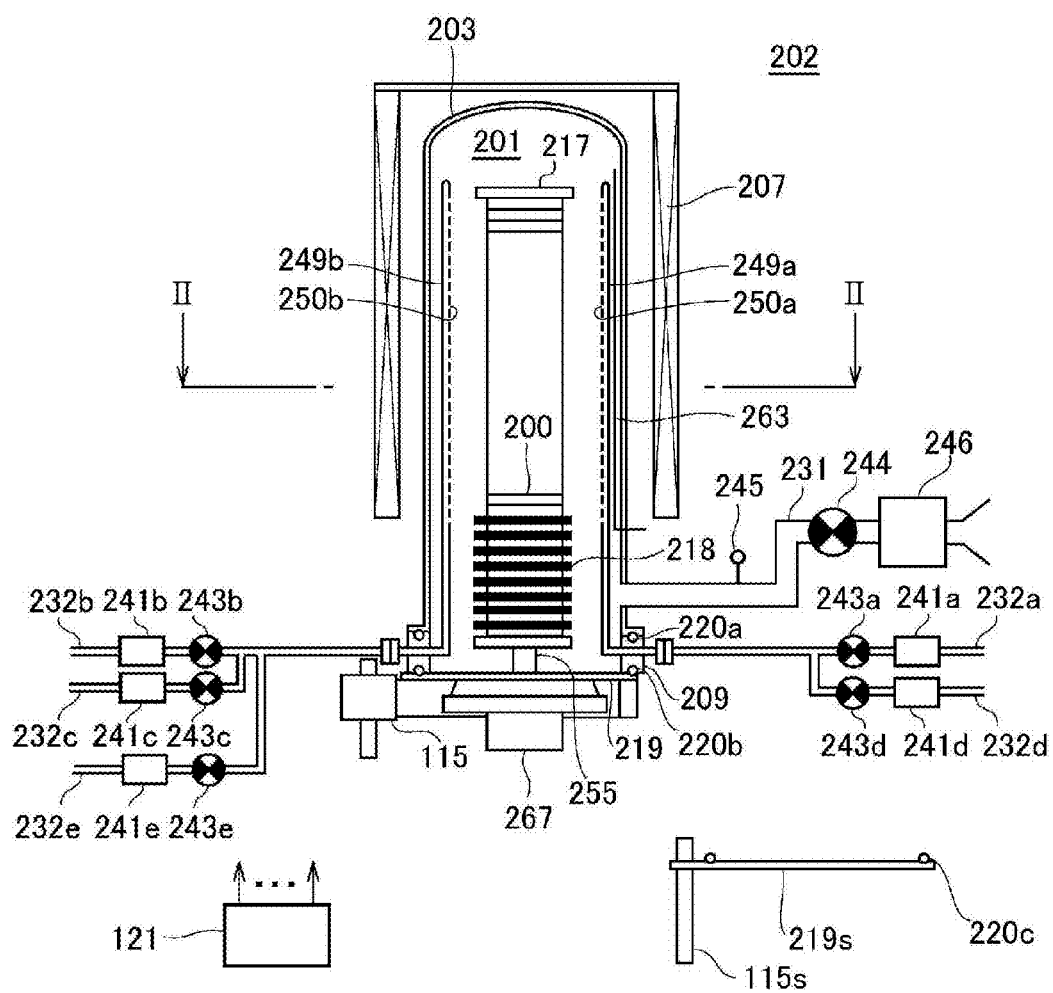
FIG. 1 is a schematic configuration diagram of a vertical processing furnace of a substrate processing apparatus applicably used in one embodiment of the present disclosure, where the processing furnace part is illustrated in a longitudinal cross-sectional view.
Figure 2:
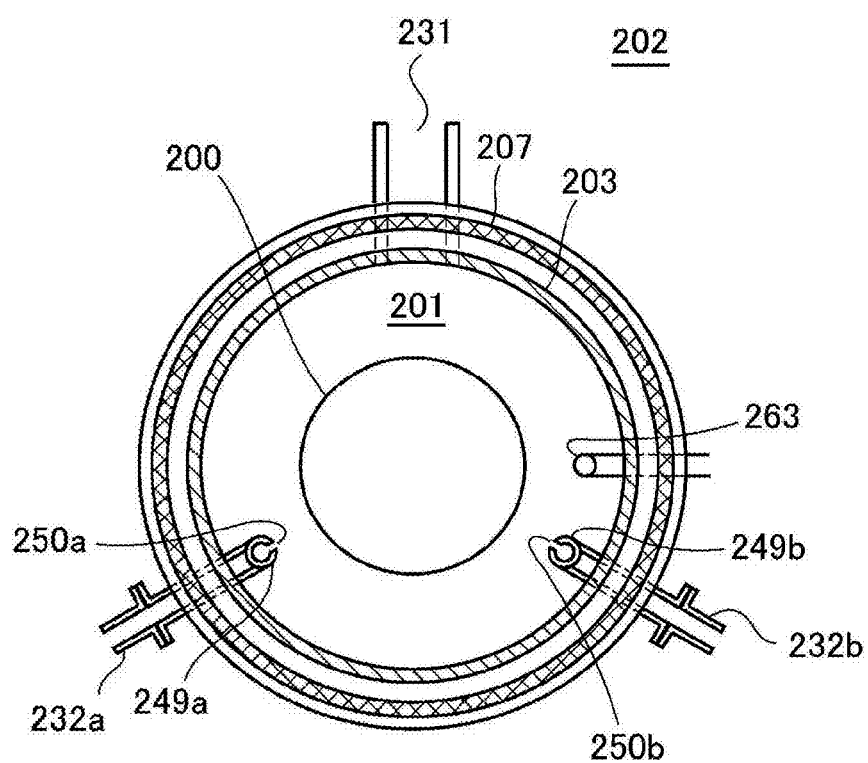
FIG. 2 is a partial schematic configuration diagram of a vertical processing furnace of a substrate processing apparatus applicably used in one embodiment of the present disclosure, where a part of the processing furnace is illustrated in a cross-sectional view taken along line II-II of FIG. 1.

One embodiment of the present disclosure will now be described with reference to FIGS. 1 to 3.

(1) Configuration of Substrate Processing Apparatus

First, a configuration of a substrate processing apparatus as a first substrate processing part will be described with reference to FIGS. 1 to 3. As shown in FIG. 1, a processing furnace 202 has a heater 207 as a heating mechanism (temperature adjusting part). The heater 207 has a cylindrical shape and is supported by a heater base (not shown) serving as a support plate so as to be vertically installed. The heater 207 also functions as an activation mechanism (excitation part) to thermally activate (excite) a gas as described later.

A reaction tube 203 is disposed inside the heater 207 to be concentric with the heater 207. The reaction tube 203 is made of a heat resistant material such as, for example, quartz ($SiO_2$) or silicon carbide (SiC), and has a cylindrical shape with its upper end closed and its lower end opened. A manifold (inlet flange) 209 is disposed below the reaction tube 203 to be concentric with the reaction tube 203. The manifold 209 is made of a metal such as, for example, stainless steel (SUS), and has a cylindrical shape with its upper end and lower end opened. An upper end portion of the manifold 209 is engaged with a lower end of the reaction tube 203 to support the reaction tube 203. An O-ring 220*a* serving as a seal member is installed between the manifold 209 and the reaction tube 203. As the manifold 209 is supported by the heater base, the reaction tube 203 is vertically installed. A process vessel (reaction vessel) mainly includes the reaction tube 203 and the manifold 209. A process chamber 201 is formed in a cylindrical hollow portion of the process vessel. The process chamber 201 is configured to accommodate wafers 200 as a plurality of substrates while the wafers 200 are horizontally arranged in a vertical direction and in a multi-stage manner in a boat 217, which will be described later.

Nozzles 249*a* and 249*b* are installed in the process chamber 201 to pass through a sidewall of the manifold 209. Gas supply pipes 232*a* and 232*b* are connected to the nozzles 249*a* and 249*b*, respectively. The gas supply pipe 232c is connected to the gas supply pipe 232b. In this manner, the two nozzles 249a and 249b, and the three gas supply pipes 232a to 232c are installed in the process vessel (manifold 209), and are configured to supply plural kinds of gases into the process chamber 201.

Mass flow controllers (MFCs) 241a to 241c, which are flow rate controllers (flow rate control parts), and valves 243a to 243c, which are opening/closing valves, are installed in the gas supply pipes 232a to 232c in this order from an upstream side, respectively. Gas supply pipes 232d and 232e configured to supply an inert gas are connected to the gas supply pipes 232a and 232b at downstream sides of the valves 243a and 243b, respectively. MFCs 241d and 241e, which are flow rate controllers (flow rate control parts), and valves 243d and 243e, which are opening/closing valves, are installed in the gas supply pipes 232d and 232e in this order from the upstream side, respectively.

Nozzles 249a and 249b are connected to leading ends of the gas supply pipes 232a and 232b, respectively. As illustrated in FIG. 2, the nozzles 249a and 249b are respectively installed in an annular space when viewed from the plane between the inner wall of the reaction tube 203 and the wafers 200, so as to extend upward along a loading direction of the wafers 200 from the lower portion of the inner wall of the reaction tube 203 to the upper portion thereof. That is, the nozzles 249a and 249b are respectively installed in a region, at a lateral side of a wafer arrangement region in which the wafers 200 are arranged, which horizontally surrounds the wafer arrangement region, so that they extend along the wafer arrangement region. That is to say, the nozzle 249a and 249b are respectively installed in a perpendicular direction to the surface (flat surface) of the wafer 200 at a lateral side of the end portion (peripheral portion) of each of the wafers 200 loaded into the process chamber 201. Each of the nozzles 249a and 249b is configured as an L-shaped long nozzle, and a horizontal portion of each of the nozzles 249a and 249b is installed to pass through a sidewall of the manifold 209 and a vertical portion thereof is installed to extend upward at least from one end side of the wafer arrangement region toward the other end side thereof. Gas supply holes 250a and 250b, through which gases are supplied, are respectively formed on side surfaces of the nozzles 249a and 249b. The gas supply holes 250a and 250b are respectively opened toward the center of the reaction tube 203 to allow supplying gases toward the wafers 200. A plurality of the gas supply holes 250a and 250b is formed over a region spanning from the lower portion of the reaction tube 203 to the upper portion thereof, and each of the gas supply holes 250a and 250b has the same opening area and is formed at the same opening pitch.

As described above, in this embodiment, the gas is transferred though the nozzles 249a and 249b disposed in a vertical-elongated space of an annular shape (when viewed from the plane), i.e., a cylindrical space, defined by the inner wall of the sidewall of the reaction tube 203 and the end portions (peripheral portions) of the plurality of wafers 200 arranged in the reaction tube 203. Then, the gas is initially ejected into the reaction tube 203 near the wafers 200 through the opened gas supply holes 410a, 420a and 430a of the nozzles 249a and 249b, respectively, and a main flow of the gas in the reaction tube 203 is oriented in a direction parallel to the surfaces of the wafers 200, i.e., a horizontal direction. With this configuration, the gas can be uniformly supplied to the respective wafers 200. This can enhance the uniformity of a thickness of a film formed on each of the wafers 200. The gas flowing on the surfaces of the wafers 200, i.e., the reacted residual gas, flows toward an exhaust port, i.e., an exhaust pipe 231 described later. However, the flow direction of the residual gas is not limited to a vertical direction but may be applicably decided depending on a position of the exhaust port.

A precursor containing a specified element, for example, a halosilane precursor gas containing Si as a specified element and a halogen element, is supplied from the gas supply pipe 232a into the process chamber 201 through the MFC 241a, the valve 243a, and the nozzle 249a.

The precursor gas refers to a precursor in a gaseous state, for example, a gas obtained by vaporizing a precursor in a liquid state under a room temperature and a normal pressure, a precursor in a gaseous state under a room temperature and a normal pressure, or the like. The halosilane precursor is a silane precursor containing a halogen group. The halogen group includes a chloro group, a fluoro group, a bromo group, an iodine group, and the like. That is, the halogen group includes a halogen element such as chlorine (Cl), fluorine (F), bromine (Br), or iodine (I). The halosilane precursor may refer to one kind of halogenide. When the term "precursor" is used herein, it may mean "a liquid precursor in a liquid state," "a precursor gas in a gaseous state", or both.

As the halosilane precursor gas, a precursor gas containing, for example, Si and Cl, namely, a chlorosilane precursor gas, may be used. The chlorosilane precursor gas acts as a silicon source (Si source) in a film forming process described later. As the chlorosilane precursor gas, for example, a hexachlorodisilane ($Si_2Cl_6$, abbreviation: HCDS) gas, may be used.

A gas containing, for example, N and C, as a first reactant having a chemical structure (molecular structure) different from that of a precursor, is supplied from the gas supply pipe 232b into the process chamber 201 through the MFC 241b, the valve 243b, and the nozzle 249b. As the gas containing N and C, for example, an amine-based gas may be used.

The amine-based gas is gaseous amine, for example, a gas which is obtained by vaporizing amine remaining in a liquid state under a room temperature and a normal pressure or a gas which contains an amine group such as amine in a gaseous state under a room temperature and a normal pressure. The amine-based gas contains amine such as ethylamine, methylamine, propylamine, isopropylamine, butylamine, isobutylamine, or the like. The term "amine" is a generic name of compounds in which hydrogen (H) of ammonia ($NH_3$) is substituted with a hydrocarbon group such as an alkyl group. Amine contains a hydrocarbon group such as an alkyl group or the like as a ligand containing C, namely, an organic ligand. Since the amine-based gas contains three elements C, N, and H but does not contain Si, it may be referred to as a Si-free gas. Since the amine-based gas does not contain Si and metal, it may be referred to as a Si-free and metal-free gas. The amine-based gas may be a substance consisting of only three elements C, N and H. The amine-based gas acts as a C source and as an N source in a film forming process described later.

As the amine-based gas, it may be possible to use, for example, a triethylamine (($C_2H_5$)$_3$N, abbreviation: TEA) gas in which the number of C-containing ligands (ethyl groups) in the chemical structural formula (in one molecule) is multiple and in which the number of C in one molecule is larger than the number of N. In the case of using amine in a liquid state under a room temperature and a normal pressure such as TEA, the amine in a liquid state is vaporized by a vaporization system such as a vaporizer or a bubbler and is supplied as an amine-based gas (TEA gas).

A third reactant having a chemical structure (molecular structure) different from that of a precursor, for example, an O-containing gas, is supplied from the gas supply pipe 232b into the process chamber 201 through the MFC 241b, the valve 243b, and the nozzle 249b. The O-containing gas acts as an oxide gas, i.e., an O source, in a film forming process described later. As the O-containing gas, for example, an oxygen ($O_2$) gas may be used.

A second reactant having a chemical structure (molecular structure) different from that of a precursor, for example an N-containing gas, is supplied from the gas supply pipe 232c into the process chamber 201 through the MFC 241c, the valve 243c, the gas supply pipe 232b, and the nozzle 249b. For the N-containing gas, for example, a hydrogen nitride-based gas may be used. The hydrogen nitride-based gas may be a substance consisting of only two elements N and H, and acts as a nitriding gas, that is, an N source, in the film forming process described later. As the hydrogen nitride-based gas, for example, an ammonia ($NH_3$) gas may be used.

An inert gas, for example a nitrogen ($N_2$) gas, is supplied from the gas supply pipes 232d and 232e into the process chamber 201 through the MFCs 241d and 241e, the valves 243d and 243e, the gas supply pipes 232a and 232b, and the nozzles 249a and 249b, respectively.

When the precursor described above is supplied from the gas supply pipe 232a, a precursor supply system is mainly configured by the gas supply pipe 232a, the MFC 241a, and the valve 243a. It may be considered that the nozzle 249a is included in the precursor supply system. The precursor supply system may be also referred to as a precursor gas supply system. When a halosilane precursor is supplied from the gas supply pipe 232a, the precursor supply system may be also referred to as a halosilane precursor supply system or a halosilane precursor gas supply system.

When a gas containing N and C is supplied from the gas supply pipe 232b, a system for supplying a gas containing N and C as a first reactant supply system is mainly configured by the gas supply pipe 232b, the MFC 241b, and the valve 243b. It may be considered that the nozzle 249b is included in the system for supplying a gas containing N and C. When an amine-based gas is supplied from the gas supply pipe 232b, the system for supplying a gas containing N and C may be also be referred to as an amine-based gas supply system or an amine supply system. Since the gas containing N ad C may be a C-containing gas or an N-containing gas, it may be also considered that the system for supplying a gas containing N and C is included in a C-containing gas supply system or an N-containing gas supply system described later.

When an O-containing gas is supplied from the gas supply pipe 232b, an O-containing gas supply system as a third reactant supply system is mainly configured by the gas supply pipe 232b, the MFC 241b, and the valve 243b. It may be considered that the nozzle 249b is included in the C-containing gas supply system. When a hydrocarbon-based gas is supplied from the gas supply pipe 232b, the C-containing gas supply system may be also referred to as a hydrocarbon-based gas supply system or a hydrocarbon supply system.

When an N-containing gas is supplied from the gas supply pipe 232c, an N-containing gas supply system as a second reactant supply system is mainly configured by the gas supply pipe 232c, the MFC 241c, and the valve 243c. It may be considered that the nozzle 249b is included in the N-containing gas supply system at a downstream side of a connection point between the gas supply pipe 232b and the gas supply pipe 232c. The N-containing gas supply system may be referred to as a nitriding gas supply system or a nitriding agent supply system. When a hydrogen nitride-based gas is supplied from the gas supply pipe 232b, the N-containing gas supply system may be referred to as a hydrogen nitride-based gas supply system or a hydrogen nitride supply system.

Also, an inert gas supply system is mainly configured by the gas supply pipes 232d and 232e, the MFCs 241d and 241e, the valves 243d and 243e.

The exhaust pipe 231 for exhausting an internal atmosphere of the process chamber 201 is installed in the reaction tube 203. A vacuum pump 246 serving as a vacuum exhaust device is connected to the exhaust pipe 231 via a pressures sensor 245, which is a pressure detector (pressure detecting part) for detecting an internal pressure of the process chamber 201, and an auto pressure controller (APC) valve 244, which is a pressure regulator (pressure regulating part). The APC valve 244 is configured to perform/stop the vacuum exhaust in the internal atmosphere of the process chamber 201 by opening/closing the valve with the vacuum pump 246 actuated, and also configured to regulate the internal pressure of the process chamber 201 by adjusting an opening degree of the valve based on the pressure information detected by the pressure sensor 245 while keeping the vacuum pump 246 actuated. An exhaust system is mainly configured by the exhaust pipe 231, the APC valve 244, and the pressure sensor 245. It may be considered that the vacuum pump 246 is included in the exhaust system.

A seal cap 219, which serves as a furnace port cover configured to hermetically seal a lower end opening of the manifold 209, is installed under the manifold 209. The seal cap 219 is configured to make contact with the lower end of the manifold 209 at the lower side in the vertical direction. The seal cap 219 is formed of a metal such as, for example, SUS, and have a disc shape. An O-ring 220b, which is a seal member making contact with the lower end portion of the manifold 209, is installed on an upper surface of the seal cap 219. A rotation mechanism 267 configured to rotate the boat 217 to be described later is installed at an opposite side of the seal cap 219 from the process chamber 201. A rotary shaft 255 of the rotation mechanism 267, which passes through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevation mechanism vertically installed outside the reaction tube 203. The boat elevator 115 is configured to load and unload the boat 217 into and from the process chamber 201 by moving the seal cap 219 up and down. The boat elevator 115 is configured as a transfer device (transfer mechanism) that transfers the boat 217, i.e., the wafers 200, into and out of the process chamber 201. In addition, a shutter 219s, which serves as a furnace port cover configured to hermetically seal the lower end opening of the manifold 209, is installed under the manifold 209 while the seal cap 219 is lowered by the boat elevator 115. The shutter 219s is formed of a metal such as, for example, SUS, and have a disc shape. An O-ring 220c, which is a seal member making contact with the lower end portion of the manifold 209, is installed on an upper surface of the shutter 219s. The opening/closing operation (elevation operation, rotation operation or the like) of the shutter 219s is controlled by a shutter opening/closing mechanism 115s.

The boat 217 as a substrate support is configured to support a plurality of, e.g., 25 to 200 wafers, in a manner such that the wafers 200 are horizontally stacked in a vertical direction and multiple stages, i.e., being separated from each other, with the centers of the wafers 200 aligned with one another. The boat 217 is form of a heat resistant material such as, for example, quartz or SiC. Heat insulating plates 218 made of a heat resistant material such as, for example, quartz or SiC are installed below the boat 217 in a multi-stage manner. With this configuration, the heat generated from the heater 207 is hardly transferred to the seal cap 219. However, this embodiment is not limited thereto. Instead of installing the heat insulating plates 218 below the boat 217, for example, a heat insulating tube as a tubular member made of a heat resistant material such as quartz or SiC may be installed below the boat 217.

A temperature sensor 263, which is a temperature detector, is installed in the reaction tube 203. Based on temperature information detected by the temperature sensor 263, the state of current being applied to the heater 207 is adjusted such that the interior of the process chamber 201 has a desired temperature distribution. Similar to the nozzles 249a and 249b, the temperature sensor 263 is configured to have an L shape, and is installed along the inner wall of the reaction tube 203.

Figure 3:
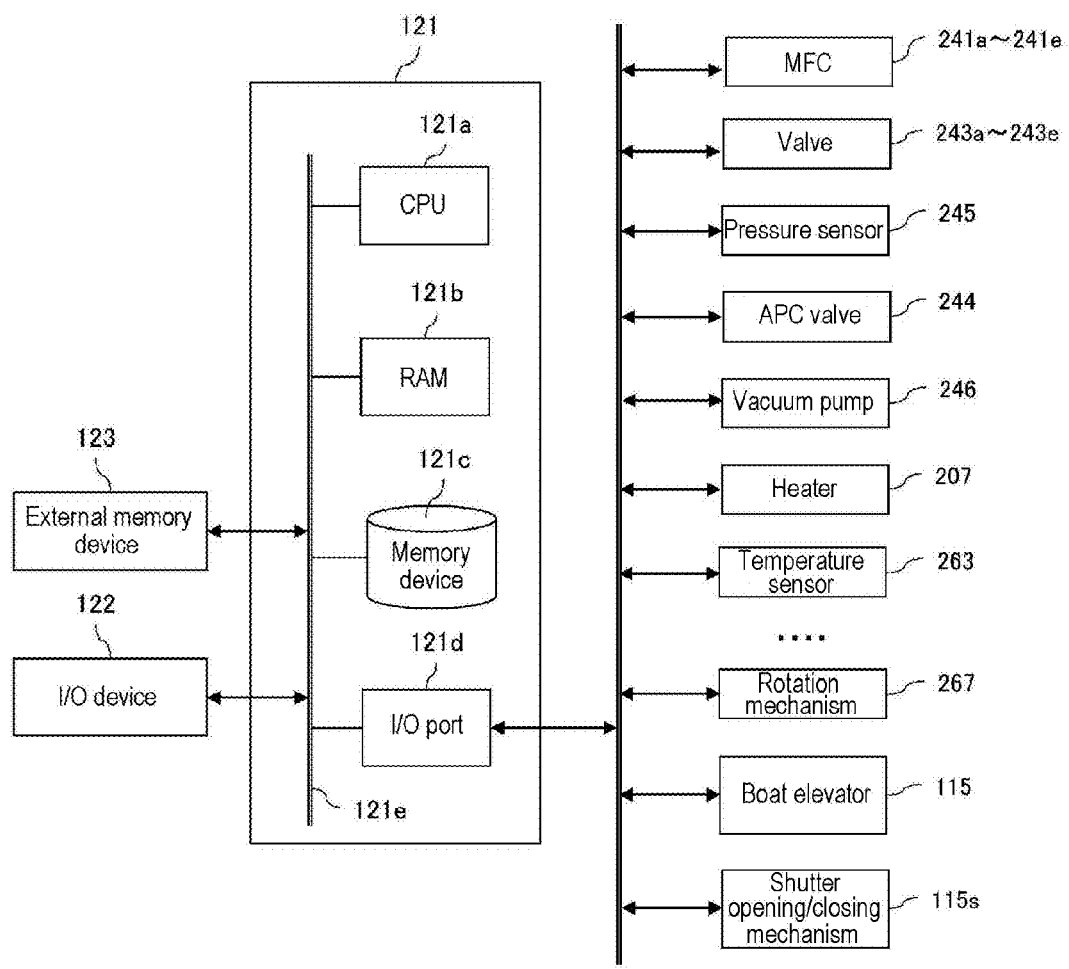
FIG. 3 is a schematic configuration diagram of a controller of the substrate processing apparatus applicably used in one embodiment of the present disclosure, where a control system of the controller is illustrated in a block diagram.

As illustrated in FIG. 3, a controller 121, which is a control part (control means), is configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 configured as, for example, a touch panel or the like is connected to the controller 121.

The memory device 121c is configured by, for example, a flash memory, a hard disc drive (HDD), or the like. A control program for controlling the operation of the substrate processing apparatus, a process recipe in which the sequences, conditions or the like of the film forming process described later are written, and the like are readably stored in the memory device 121c. The process recipe, which is a combination of sequences, causes the controller 121 to execute each sequence in the film forming process described later in order to obtain a predetermined result, and functions as a program. Hereinafter, the program recipe, the control program, or the like may be generally referred to simply as a program. Also, the process recipe will be simply referred to as a recipe. When the term "program" is used herein, it is intended to encompass only the recipe, only the control program, or both. The RAM 121b is configured as a memory area (work area) in which a program, data, or the like read by the CPU 121a is temporarily stored.

The I/O port 121d is connected to the MFCs 241a to 241e, the valves 243a to 243e, the pressure sensor 245, the APC valve 244, the vacuum pump 246, the temperature sensor 263, the heater 207, the rotation mechanism 267, the boat elevator 115, the shutter opening/closing mechanism 115s, and the like as described above.

The CPU 121a is configured to read and execute the control program from the memory device 121c, and also to read the recipe from the memory device 121c as an operation command is input from the input/output device 122. The CPU 121a is configured to, according to the content of the read recipe, control a flow rate adjusting operation of various kinds of gases by the MFCs 241a to 241e, an opening/closing operation of the valves 243a to 243e, an opening/closing operation of the APC valve 243, a pressure regulating operation by the APC valve 243 based on the pressure sensor 245, a start/stop operation of the vacuum pump 246, a temperature adjusting operation of the heater 207 based on the temperature sensor 263, a rotation operation and a rotation speed adjusting operation of the boat 217 by the rotation mechanism 267, an operation of moving the boat 217 up and down by the boat elevator 115, an opening/closing operation of the shutter 219s by the shutter opening/closing mechanism 115s, and the like.

The controller 121 may be configured by installing the program, which is stored in an external memory device (for example, a magnetic tape, a magnetic disc such as a flexible disc or a hard disc, an optical disc such as a compact disc (CD) or a digital versatile disc (DVD), a magneto-optical (MO) disc, a semiconductor memory such as a universal serial bus (USB) memory or a memory card, etc.) 123, on the computer. The memory device 121c or the external memory device 123 is configured as a non-transitory computer-readable recording medium. Hereinafter, they will be generally referred to simply as "a recording medium." When the term "recording medium" is used herein, it intended to encompass only the memory device 121c, only the external memory device 123, or both. Also, the program may be supplied to the computer through the use of a communication means such as the Internet or a dedicated line, without having to go through the external memory device 123.

(2) Film Forming Process

An example of a sequence of forming a film on a substrate, which is one of the processes of manufacturing a semiconductor device using the aforementioned substrate processing apparatus, will be described with reference to FIG. 4. In the following description, the operations of the respective parts constituting the substrate processing apparatus are controlled by the controller 121.

Figure 4:
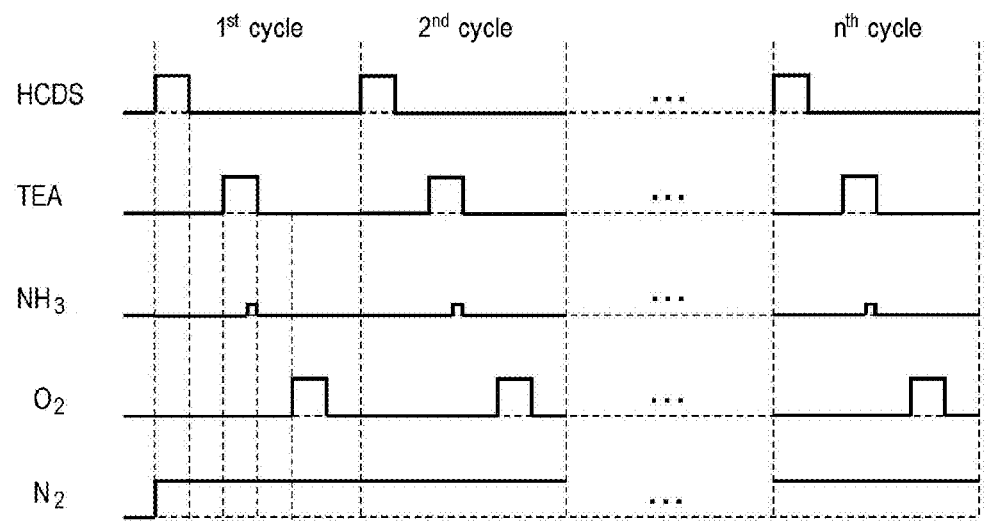
FIG. 4 is a diagram illustrating a timing of the gas supply in a film forming sequence according to one embodiment of the present disclosure, and exemplary modifications thereof.
Figure 4:
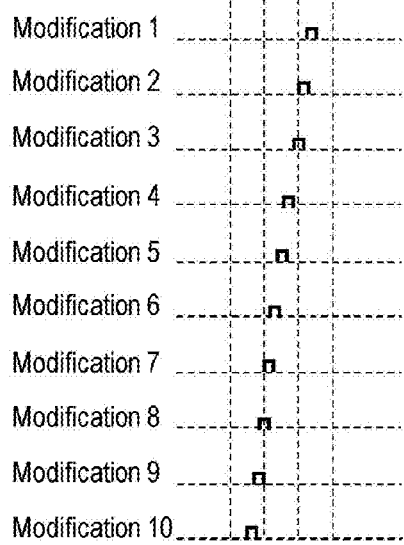

In the basic sequence illustrated in FIG. 4, a silicon oxycarbonitride film (SiOCN film) containing Si, O, C, and N is formed on the wafer 200 by performing a cycle a plurality of number of times (n times), the cycle including:

step 1 of supplying an HCDS gas as a precursor to the wafer 200 as a substrate, step 2a of supplying an a TEA gas as a first reactant to the wafer 200;

step 2b of supplying an $NH_3$ gas as a second reactant to the wafer 200; and step 3 of supplying an $O_2$ gas as a third reactant to the wafer 200.

In addition, in the basic sequence illustrated in FIG. 4, step 1, step 2a, and step 3 are performed non-simultaneously, and step 2b is performed simultaneously with step 2a, namely, performed during a period in which step 2a is performed. Specifically, step 2a starts before step 2b, and thereafter, step 2b starts to be performed simultaneously with step 2a, and step 2b is completed simultaneously with the completion of step 2b.

Further, in the basic sequence illustrated in FIG. 4, a supply amount of the $NH_3$ gas at step 2b is set to be smaller than that of the TEA gas at step 2a. That is, a supply amount of the $NH_3$ gas per cycle is set to be smaller than that of the TEA gas per cycle.

In the present disclosure, the basic sequence illustrated in FIG. 4 may be expressed as follows for convenience. In the description of the following modifications or other embodiments, the same expressions will be also used.

$$\text{HCDS} \rightarrow [\text{TEA}+\text{NH}_3(\text{TEA}>\text{NH}_3)] \rightarrow O_2] \times n \Rightarrow \text{SiOCN}$$

When the term "wafer" is used herein, it should be understood as either a "wafer per se," or "the wafer and a layered body (aggregate) of certain layers or films formed on a surface of the wafer", that is, certain layers or films formed on the surface of the wafer is collectively referred to as a wafer. Also, the term "surface of a wafer" is used herein, it should be understood as either a "surface (exposed surface) of a wafer per se," or a "surface of a certain layer or film formed on the wafer, i.e., an outermost surface of the wafer as a layered body."

Thus, in the present disclosure, the expression "a specified gas is supplied to a wafer" may mean that "the specified gas is directly supplied to a surface (exposed surface) of a wafer per se," or that "the specified gas is supplied to a surface of a certain layer or film formed on the wafer, i.e., to an outermost surface of the wafer as a layered body." Also, in the present disclosure, the expression "a certain layer (or film) is formed on a wafer" may mean that "the certain layer (or film) is directly formed on the surface (exposed surface) of the wafer per se," or that "the certain layer (or film) is formed on the surface of a certain layer or film formed on the wafer, i.e., on an outermost surface of the wafer as a layered body."

Also, in the present disclosure, the term "substrate" is interchangeably used with the term "wafer."

(Substrate Preparation Step)

When a plurality of wafers 200 is charged on the boat 217 (wafer charging), the shutter 219s is moved by the shutter opening/closing mechanism 115s and the lower end opening of the manifold 209 is opened (shutter open). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the manifold 209 via the O-ring 220b.

(Pressure and Temperature Adjustment Step)

Vacuum exhaust (decompression exhaust) is performed by the vacuum pump 246 such that the internal pressure of the process chamber 201, i.e., the pressure of a space where the wafers 200 exist becomes equal to a desired pressure (vacuum level). At this time, the internal pressure of the process chamber 201 is measured by the pressure sensor 245, and the APC valve 243 is feedback-controlled based on the measured pressure information. The vacuum pump 246 remains activated at least until the film forming process described later is completed. Further, the wafers 200 in the process chamber 201 are heated by the heater 207 to a desired temperature. At this time, the state of current being applied to the heater 207 is feedback-controlled based on the temperature information detected by the temperature sensor 263 such that the interior of the process chamber 201 has a desired temperature distribution (temperature adjustment). The heating of the interior of the process chamber 201 by the heater 207 is continuously performed at least until the film forming process described later is completed. Subsequently, the boat 217 and wafers 200 begin to be rotated by the rotation mechanism 267. The rotation of the boat 217 and wafers 200 by the rotation mechanism 267 is continuously performed at least until the film forming process described later is completed.

(Film Forming Step)

Thereafter, steps 1, 2a, 2b and 3 are respectively performed at the timings described below.

[Step 1]

At this step, an HCDS gas is supplied to the wafers 200 in the process chamber 201.

Specifically, the valve 243a is opened to cause the HCDS gas to flow through the gas supply pipe 232a. A flow rate of the HCDS gas is adjusted by the MFC 241a, and the flow rate-adjusted HCDS gas is supplied into the process chamber 201 through the nozzle 249a and then exhausted through the exhaust pipe 231. At this time, the HCDS gas is supplied to the wafers 200. At the same time, the valve 243d is opened to cause an $N_2$ gas to flow through the gas supply pipe 232d. A flow rate of the $N_2$ gas is adjusted by the MFC 241d, and the flow rate-adjusted $N_2$ gas is supplied into the process chamber 201 together with the HCDS gas and then exhausted through the exhaust pipe 231.

Further, in order to prevent the infiltration of the HCDS gas into the nozzle 249b, the valve 243e is opened to cause the $N_2$ gas to flow through the gas supply pipe 232e. The $N_2$ gas is supplied into the process chamber 201 through the gas supply pipe 232b and the nozzle 249b, and then exhausted through the exhaust pipe 231.

At this time, the APC valve 244 is appropriately adjusted such that the internal pressure of the process chamber 201 falls within a range of, e.g., 1 to 2666 Pa, preferably, 67 to 1333 Pa. A supply flow rate of the HCDS gas controlled by the MFC 241a is set to fall within a range of, e.g., 1 to 2000 sccm, preferably, 10 to 1000 sccm. Supply flow rates of the $N_2$ gas controlled by the MFCs 241d and 241e are set to fall within a range of, e.g., 100 to 10000 sccm, respectively. A time period during which the HCDS gas is supplied to the wafer 200 is set to fall within a range of, e.g., 1 to 120 seconds, preferably, 1 to 60 seconds. The temperature of the heater 207 is set such that the temperature of the wafer 200 falls within a range of, e.g., 250 to 700 degrees C., preferably, 300 to 650 degrees C., more preferably, 350 to 600 degrees C.

If the temperature of the wafer 200 is less than 250 degrees C., a practical deposition rate may not be obtained because the HCDS is hardly chemisorbed onto the wafer 200. This may be solved by setting the temperature of the wafer 200 at 250 degrees C. or higher. By setting the temperature of the wafer 200 at 300 degrees C. or higher, further, 350 degrees C. or higher, it becomes possible to further sufficiently adsorb the HCDS onto the wafer 200 and to obtain a further sufficient deposition rate.

If the temperature of the wafer 200 exceeds 700 degrees C., an excessive vapor phase reaction occurs to degrade the film thickness uniformity, making it difficult to control the film thickness uniformity. By adjusting the temperature of the wafer to 700 degrees C. or less, i.e., by causing an appropriate vapor reaction to occur, such degradation of the film thickness uniformity can be suppressed, and it becomes possible to control the film thickness uniformity. In particular, by adjusting the temperature of the wafer 200 to 650 degrees C. or less, further, 600 degrees C. or less, the surface reaction becomes dominant relative to the vapor phase reaction. This makes it easy to assure the film thickness uniformity and to control the film thickness uniformity.

Thus, the temperature of the wafer 200 may be set to fall within a range of 250 to 700 degrees C., preferably, 300 to 650 degrees C., more preferably, 350 to 600 degrees C.

By supplying the HCDS gas to the wafer 200 under the aforementioned conditions, a first layer (initial layer), for example, a Si-containing layer containing Cl having a thickness of less than one atomic layer to several atomic layers is formed on the outermost surface of the wafer 200 (a base film including the SiO film of the surface). The Si-containing layer containing Cl may include a Si layer containing Cl, an adsorption layer of HCDS, or both.

The Si layer containing Cl is a general name which encompasses not only a continuous layer or discontinuous layer formed of Si and containing Cl but also a Si thin film containing Cl obtained by layering such layers. The continuous layer formed of Si and containing Cl may be referred to as a Si thin film containing Cl. Si forming the Si layer containing Cl includes Si whose bond to Cl is completely broken, in addition to Si whose bond to Cl is not completely broken.

The adsorption layer of the HCDS includes not only a continuous adsorption layer formed of HCDS molecules but also a discontinuous adsorption layer thereof. In other words, the adsorption layer of the HCDS includes an adsorption layer having a thickness of one molecular layer formed of HCDS molecules or an adsorption layer having a thickness of less than one molecular layer. The HCDS molecules that form the adsorption layer of the HCDS include molecules in which a bond of Si and Cl is partially broken. That is, the adsorption layer of the HCDS may include a physical adsorption layer of the HCDS, a chemical adsorption layer of the HCDS, or both.

Herein, the layer having a thickness of less than one atomic layer means an atomic layer that is discontinuously formed. The layer having a thickness of one atomic layer means an atomic layer that is continuously formed. The layer having a thickness of less than one molecular layer means a molecular layer that is discontinuously formed. The layer having a thickness of one molecular layer means a molecular layer that is continuously formed. The Si-containing layer containing Cl may include both a Si layer containing Cl and an adsorption layer of the HCDS. As described above, the expressions such as "one atomic layer", "several atomic layers", and the like will be used with respect to the Si-containing layer containing Cl.

Under a condition in which the HCDS gas is autolyzed (or pyrolyzed), Si is deposited on the wafer 200 to form the Si layer containing Cl. Under a condition in which the HCDS gas is not autolyzed (or pyrolyzed), the HCDS is adsorbed onto the wafer 200 to form the adsorption layer of the HCDS. From the viewpoint of increasing a deposition rate, when the Si layer containing Cl is formed on the wafer 200, the deposition rate may be greater than that when the adsorption layer of the HCDS gas is formed on the wafer 200. Hereinafter, the Si-containing layer containing Cl will be also referred to simply as a Si-containing layer for convenience.

If the thickness of the first layer formed on the wafer 200 exceeds several atomic layers, a modification action at steps 2a, 2b and 3 to be described later does not affect the entire first layer. In addition, a minimum value of the thickness of the first layer to be formed on the wafer 200 is less than one atomic layer. Accordingly, it is preferred that the thickness of the first layer is set to fall within a range of less than one atomic layer to several atomic layers. By setting the thickness of the first layer to be one atomic layer or less, i.e., one atomic layer or less than one atomic layer, it becomes possible to relatively increase the modification action at steps 2a, 2b and 3 to be described later and to shorten the time required in the modification reaction at steps 2a, 2b and 3. It is also possible to shorten the time required for forming the first layer at step 1a. As a result, a processing time per cycle can be reduced, and thus, a total processing time can be also reduced. That is to say, the deposition rate can be increased. In addition, by setting the thickness of the first layer to be one atomic layer or less, it becomes possible to improve the controllability of the film thickness uniformity.

After the first layer is formed, the valve 243a is closed to stop the supply of the HCDS gas. At this time, the APC valve 244 is kept opened and the interior of the process chamber 201 is vacuum-exhausted by the vacuum pump 246, whereby the unreacted HCDS gas or the HCDS gas contributed to the formation of the first layer, which remains in the process chamber 201, is removed from the interior of the process chamber 201. At this time, the valves 243d and 243e are kept opened and the supply of the $N_2$ gas into the process chamber 201 is maintained. The $N_2$ gas serves as a purge gas. Thus, the gas remaining in the process chamber 201 can be effectively removed from the process chamber 201.

At this time, the gas remaining in the process chamber 201 may not be completely removed and the interior of the process chamber 201 may not be completely purged. If the gas remaining in the process chamber 201 is small in amount, no adverse effect is generated at steps 2a and 2b performed thereafter. The flow rate of the $N_2$ gas supplied into the process chamber 201 need not be a large flow rate. For example, by supplying the $N_2$ gas in an amount equal to the volume of the reaction tube 203 (or the process chamber 201), it is possible to perform the purge in such a way that no adverse effect is generated at steps 2a and 2b. Inasmuch as the interior of the process chamber 201 is not completely purged as mentioned above, it is possible to shorten the purge time and to improve the throughput. It also becomes possible to reduce the consumption of the $N_2$ gas to a minimum necessary level.

As the precursor gas, it may be possible to use not only the HCDS gas but also a halosilane precursor gas such as, for example, a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane gas, i.e., silicon tetrachloride ($SiCl_4$, abbreviation: STC) gas, or an octachlorotrisilane ($Si_3Cl_8$, abbreviation: OCTS) gas.

In addition, as the precursor gas, it may be possible to use an alkylenehalosilane precursor gas such as an ethylenebis (trichlorosilane) gas, i.e., a 1,2-bis(trichlorosilyl)ethane (($SiCl_3)_2C_2H_4$, abbreviation: BTCSE) gas, or a methylenebis (trichlorosilane) gas, i.e., a bis(trichlorosylil) methane (($SiCl_3)_2CH_2$, abbreviation: BTCSM) gas.

Also, as the precursor gas, it may be possible to use an alkylhalosilane precursor gas such as a 1,1,2,2-tetrachloro-1,2-dimethyldisilane(($CH_3)_2Si_2Cl_4$, abbreviation: TCDMDS) gas, a 1,2-dichloro-1,1,2,2-tetramethyldisilane (($CH_3)_4$ $Si_2Cl_2$, abbreviation: DCTMDS) gas, or a 1-monochloro-1,1,2,2,2-pentamethyldisilane (($CH_3)_5Si_2Cl$, abbreviation: MCPMDS) gas.

Also, as the precursor gas, it may be possible to use an inorganic precursor gas such as a monosilane ($SiH_4$, abbreviation: MS) gas, a disilane ($Si_2H_6$, abbreviation: DS) gas, or a trisilane ($Si_3H_8$, abbreviation: TS) gas.

Also, as the precursor gas, it may be possible to use an aminosilane precursor gas such as, for example, tetrakisdimethylaminosilane ($Si[N(CH_3)_2]_4$, abbreviation: 4DMAS) gas, a trisdimethylamonisilane ($Si[N(CH_3)_2]_3H$, abbreviation: 3DMAS) gas, a bisdiethylaminosilane ($Si[N(C_2H_5)_2]_2$ $H_2$, abbreviation: BDEAS) gas, or a bis tert-butylaminosilane($SiH_2[NH(C_4H_9)]_2$, abbreviation: BTBAS) gas.

As the inert gas, it may be possible to use not only the $N_2$ gas but also a rare gas such as, for example, an Ar gas, a He gas, a Ne gas, or a Xe gas.

[Steps 2a and 2b]

After step 1 is completed, step 2a of supplying a TEA gas to the first layer formed on the wafer 200 in the process chamber 201, i.e., on the wafer 200, starts. This step starts before step 2b described later.

At this step, the opening/closing control of the valves 243b, 243d and 243e are performed in the same manner as the opening/closing control of the valves 243a, 243d, and 243e performed at step 1. The flow rate of the TEA gas is adjusted by the MFC 241b, and the flow rate-adjusted TEA gas is supplied into the process chamber 201 through the nozzle 249b and then exhausted through the exhaust pipe 231. At this time, the TEA gas is supplied to the wafer 200.

The supply flow rate of the TEA gas controlled by the MFC 241b is set to fall within a range of, e.g., 200 to 10000 sccm. The internal pressure of the process chamber 201 is set to fall within a range of, e.g., 1 to 5000 Pa, preferably, 1 to 4000 Pa. By setting the internal pressure of the process chamber 201 to such a relatively high pressure, it becomes possible to thermally activate the TEA gas under a non-plasma condition. If the TEA gas is thermally activated and supplied, a relatively more soft reaction can occur, facilitating the formation of a second layer (SiCN layer) to be described later. A time period during which the TEA gas is supplied to the wafer 200 is set to fall within a range of, e.g., 2 to 120 seconds, preferably, 2 to 60 seconds. Other process conditions may be the same as, for example, those used at step 1.

By supplying the TEA gas to the wafer 200 under the aforementioned conditions, it is possible to have the first layer formed on the wafer 200 at step 1 react with the TEA gas. That is, it is possible to have Cl (chloro group) as the halogen element (halogen group) contained in the first layer react with the ligand (ethyl group) contained in the TEA gas. Accordingly, it is possible to extract (separate) at least a portion of Cl contained in the first layer from the first layer and to separate at least a portion of a plurality of ethyl groups contained in the TEA gas from the TEA gas. Then, it becomes possible to bond N of the TEA gas from which at least a portion of the ethyl groups were separated and Si contained in the first layer to form a Si—N bond. At this time, it also becomes possible to bond C contained in the ethyl group (—$CH_2CH_3$) separated from the TEA gas and Si contained in the first layer to form a Si—C bond. As a result, Cl is desorbed from the first layer and the N component is newly introduced into the first layer. Also, at this time, the C component is newly introduced into the first layer. In this manner, as the TEA gas is supplied, a portion of the first layer is modified and the first layer includes N and C. Hereinafter, the first layer including N and C will be simply referred to as a first layer for convenience.

When the aforementioned reaction is performed for a predetermined period of time, step 2b of supplying the $NH_3$ gas to the wafer 200 starts in a state where the supply of the TEA gas to the wafer 200 is maintained. That is, step 2a of supplying the TEA to the wafer 200 and step 2b of supplying the $NH_3$ gas to the wafer 200 are simultaneously performed.

At this step, the valve 243c is opened while keeping the valves 243b, 243d, and 243e opened. A flow rate of the $NH_3$ gas is adjusted by the MFC 241c, and the flow rate-adjusted $NH_3$ gas is supplied into the process chamber 201 through the gas supply pipe 232b and the nozzle 249b and then exhausted through the exhaust pipe 231. At this time, the $NH_3$ gas is supplied together with the TEA gas to the wafer 200.

A supply amount of the $NH_3$ gas with respect to the wafer 200 at step 2b is set to be smaller than that of the TEA gas with respect to the wafer 200 at step 2a.

For example, a supply amount of the $NH_3$ gas with respect to the wafer 200 may be set to be smaller than that of the TEA gas with respect to the wafer 200 by setting a supply time (a performing time of step 2b) of the $NH_3$ gas with respect to the wafer 200 to be shorter than that (performing time of step 2a) of the TEA gas with respect to the wafer 200. The supply time of the $NH_3$ gas with respect to the wafer 200 is preferably set to fall within a range of, for example, $\frac{1}{120}$ to $\frac{1}{2}$, preferably, $\frac{1}{60}$ to $\frac{5}{12}$. The supply time of the $NH_3$ gas with respect to the wafer 200 may be set to fall within a range of, for example, 1 to 30 seconds, preferably, 1 to 20 seconds, more preferably, 1 to 10 seconds.

If the supply time of the $NH_3$ gas is less than $\frac{1}{120}$ of the supply time of the TEA gas, the effect of newly adding N to the first layer by supplying the $NH_3$ gas together with the TEA gas may not be obtained, making it difficult to increase the concentration of N of a finally formed film. By setting the supply time of the $NH_3$ gas to be $\frac{1}{120}$ or greater of the supply time of the TEA gas, it becomes possible to obtain the effect of newly adding N to the first layer by supplying the $NH_3$ gas together with the TEA gas, thus increasing the concentration of N of the finally formed film. By setting the supply time of the $NH_3$ gas to be $\frac{1}{60}$ or greater of the supply time of the TEA gas, it becomes possible to reliably obtain the effect of newly adding N to the first layer by supplying of the $NH_3$ gas together with the TEA gas, thus reliably increasing the concentration of N of the finally formed film.

If the supply time of the $NH_3$ gas exceeds $\frac{1}{2}$ of the supply time of the TEA gas, C introduced to the first layer by supplying the TEA gas may be desorbed from the first layer due to the effects of the $NH_3$ gas having reactivity higher than that of the TEA gas. In addition, as described later, a reaction site (adsorption site) of the first layer may be deprived by the $NH_3$ gas, which does not obtain the effect of newly adding C to the first layer according to the continuous supply of the TEA gas together with the $NH_3$ gas. As a result, it may be difficult to increase the concentration of C of the finally formed film or the finally formed film may be a C-free film. By setting the supply time of the $NH_3$ gas to be $\frac{1}{2}$ or less of the supply time of the TEA gas, it becomes possible to suppress the desorption of C from the first layer, and also to obtain the effect of newly adding C to the first layer by continuously supplying the TAE gas together with the $NH_3$ gas. By setting the supply time of the $NH_3$ gas to be $\frac{5}{12}$ or less of the supply time of the TEA gas, it becomes possible to reliably suppress the desorption of C from the first layer, and also to reliably obtain the effect of newly adding C to the first layer by continuously supplying the TAE gas together with the $NH_3$ gas.

In addition, for example, the supply amount of the $NH_3$ gas with respect to the wafer 200 may be set to be smaller than the supply amount of the TEA gas with respect to the wafer 200 by setting a supply flow rate of the $NH_3$ gas with respect to the wafer 200 (a supply flow rate of the $NH_3$ gas at step 2b) to be smaller than that of the TEA gas with respect to the wafer 200 (a supply flow rate of the TEA gas at step 2b). The supply flow rate of the $NH_3$ gas is preferably set to fall with a range of, for example, $\frac{1}{100}$ to $\frac{1}{2}$, preferably, $\frac{1}{50}$ to $\frac{2}{5}$. The supply flow rate of the $NH_3$ gas with respect to the wafer 200 may be set to fall within a range of, for example, 100 to 1000 sccm, preferably, 100 to 500 sccm.

If the supply flow rate of the $NH_3$ gas is less than $\frac{1}{100}$ of the supply flow rate of the TEA gas, it is not possible to obtain the effect of newly adding N to the first layer by supplying the $NH_3$ gas together with the TEA gas, thus making it difficult to increase the concentration of N of the finally formed film. By setting the supply flow rate of the $NH_3$ gas to be greater than $\frac{1}{100}$ of the supply flow rate of the TEA gas, it becomes possible to obtain the effect of newly adding N to the first layer by supplying the $NH_3$ gas together with the TEA gas, thus increasing the concentration of N of the finally formed film. By setting the supply flow rate of the $NH_3$ gas to be greater than $\frac{1}{50}$ of the supply flow rate of the TEA gas, it becomes possible to reliably obtain the effect of newly adding N to the first layer by supplying the $NH_3$ gas together with the TEA gas, thus reliably increasing the concentration of N of the finally formed film.

If the supply flow rate of the $NH_3$ gas exceeds ½ of the supply flow rate of the TEA gas, C introduced to the first layer by supplying the TEA gas may be desorbed from the first layer due to the effects of the $NH_3$ gas having reactivity higher than that of the TEA gas. In addition, as described later, a reaction site of the first layer may be deprived by the $NH_3$ gas, which does not obtain the effect of newly adding C to the first layer according to the continuous supply of the TEA gas together with the $NH_3$ gas. As a result, it may be difficult to increase the concentration of C of the finally formed film or the finally formed film may be a C-free film. By setting the supply flow rate of the $NH_3$ gas to be ½ or less of the supply flow rate of the TEA gas, it becomes possible to suppress the desorption of C from the first layer, and also to obtain the effect of newly adding C to the first layer by continuously supplying the TAE gas together with the $NH_3$ gas. By setting the supply flow rate of the $NH_3$ gas to be ⅖ or less of the supply flow rate of the TEA gas, it becomes possible to reliably suppress the desorption of C from the first layer, and also to reliably obtain the effect of newly adding C to the first layer by continuously supplying the TAE gas together with the $NH_3$ gas.

In addition, in performing step 2b, when the supply flow rate of the $NH_3$ gas with respect to the wafer 200 is set to be smaller than that of the TEA gas with respect to the wafer 200, the partial pressure of the $NH_3$ gas in the process chamber 201 becomes smaller than that of the TEA gas in the process chamber 201. That is, when the supply flow rate of the $NH_3$ gas is set as mentioned above, the partial pressure of the $NH_3$ gas in the process chamber 201 is within a range of 1/100 to ½ of the partial pressure of the TEA gas, preferably, 1/50 to ⅖. By adjusting the partial pressure of the $NH_3$ gas to fall within such a range, it becomes possible to achieve the aforementioned effects.

FIG. 4 is a diagram illustrating an example in which a supply time of the $NH_3$ gas with respect to the wafer 200 is set to be smaller than that of the TEA gas and a supply flow rate of the $NH_3$ gas with respect to the wafer 200 is set to be smaller than that of the TEA gas with respect to the wafer 200.

Other processing conditions may be the same as, for example, those of step 2a before step 2b starts.

By supplying the TEA gas or the $NH_3$ gas to the wafer 200 under the aforementioned conditions, it possible to modify (to nitride or to add C) at least a portion of the first layer containing N and C by supplying the TEA gas before step 2b starts. That is, it is possible to form a Si—N bond in the first layer by adding at least a portion of the N component contained in the $NH_3$ gas into the first layer. Also, it is possible to further form a Si—N bond or a Si—C bond in the first layer by adding at least a portion of the N component or the C component contained in the TEA gas into the first layer. As the first layer is modified, a silicon carbonitride (SiCN layer) containing Si, C, and N is formed as a second layer on the wafer 200. As the TEA gas is supplied before step 2b starts, the second layer becomes a layer having a large amount of the N component contained therein, compared with the first layer containing N and C. In addition, as the TEA gas is supplied before step 2b starts, the second layer may become a layer having a large amount of the C component contained therein, compared with the first layer containing N and C.

During the formation of the second layer, the Cl contained in the first layer or the H contained in the TEA gas and the $NH_3$ gas forms a gaseous substance containing at least any one of Cl and H in the curse of the modification reaction of the first layer using the TEA gas or the $NH_3$ gas and the gaseous substance thus formed is discharged from the interior of the process chamber 201 through the exhaust pipe 231. That is, the impurities such as Cl contained in the first layer are extracted or desorbed from the first layer, and are eventually separated from the first layer. Thus, the second layer becomes a layer having a smaller amount of impurities such as Cl than the first layer.

After the second layer is formed, the valves 243b and 243c are closed to simultaneously stop the supply of the TEA gas and the $NH_3$ gas. Then, the unreacted TEA gas, the TEA gas or the $NH_3$ gas contributed to the formation of the second layer, or the reaction byproduct, which remains in the process chamber 201, is removed from the interior of the process chamber 201 by the same processing procedures as used at step 1. At this time, similar to step 1, the gas or the like which remains in the process chamber 201 may not be completely removed.

As the amine-based gas, it may be possible to use not only the TEA gas but also an ethylamine-based gas such as a diethylamine (($C_2H_5$)$_2$N)H, abbreviation: DEA) gas or a monoethylamine ($C_2H_5NH_2$, abbreviation: MEA) gas. Also, as the amine-based gas, it may be possible to use a methylamine-based gas such as a trimethylamine (($CH_3$)$_3$N, abbreviation: TMA) gas, a dimethylamine (($CH_3$)$_2$NH, abbreviation: DMA) gas, or a monomethylamine ($CH_3NH_2$, abbreviation: MMA) gas. Also, as the amine-based gas, it may be possible to use a propylamine-based gas such as a tripropylamine (($C_3H_7$)$_3$N, abbreviation: TPA) gas, a dipropylamine (($C_3H_7$)$_2$NH, abbreviation: DPA) gas, or a monopropylamine ($C_3H_7NH_2$, abbreviation: MPA) gas. Also, as the amine-based gas, it may be possible to use an isopropylamine-based gas such as a triisopropylamine ([($CH_3$)$_2$CH]$_3$N, abbreviation: TIPA) gas, a diisopropylamine ([($CH_3$)$_2$CH]$_2$NH, abbreviation: DIPA) gas, or a monoisopropylamine (($CH_3$)$_2$CHNH_2$, abbreviation: MIPA) gas. Also, as the amine-based gas, it may be possible to use a butylamine-based gas such as tributylamine (($C_4H_9$)$_3$N, abbreviation: TBA) gas, a dibutylamine (($C_4H_9$)$_2$NH, abbreviation: DBA) gas, or a monobutylamine ($C_4H_9NH_2$, abbreviation: MBA) gas. Also, as the amine-based gas, it may be possible to use an isobutylamine-based gas such as a triisobutylamine ([($CH_3$)$_2$CHCH$_2$]$_3$N, abbreviation: TIBA) gas, a diisobutylamine ([($CH_3$)$_2$CHCH$_2$]$_2$NH, abbreviation: DIBA) gas, or a monoisobutylamine (($CH_3$)$_2$CHCH$_2$NH$_2$, abbreviation: MIBA) gas.

That is, as the amine-based gas, it also may possible to preferably use, for example, at least one of the gases of $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, $[(CH_3)_2CHCH_2]_xNH_{3-x}$ (in the chemical formula, x is an integer ranging from 1 to 3).

Also, as the gas containing C and N instead of the amine-based gas, it may be possible to use a gas containing an organic hydrazine compound, i.e., an organic hydrazine-based gas. As the organic hydrazine-based gas, it may be possible to use a methylhydrazine-based gas such as a monomethylhydrazine (($CH_3$)HN$_2$H$_2$, abbreviation: MMH) gas, a dimethylhydrazine (($CH_3$)$_2$N$_2$H$_2$, abbreviation: DMH) gas, or a trimethylhydrazine (($CH_3$)$_2$N$_2$($CH_3$)H, abbreviation: TMH) gas. Also, as the organic hydrazine-based gas, it may be possible to use an ethylhydrazine-based gas such as an ethylhydrazine (($C_2H_5$)HN$_2$H$_2$, abbreviation: EH) gas.

As the nitriding gas, it may be possible to use not only the $NH_3$ gas but also, for example, a hydrogen nitride-based gas such as a diazene ($N_2H_2$) gas, a hydrazine ($N_2H_4$) gas, an $N_3H_8$ gas or the like, or a gas containing these compounds.

As the inert gas, it may be possible to use not only the $N_2$ gas but also a rare gas such as, for example, an Ar gas, a He gas, a Ne gas, or a Xe gas.

[Step 3]

After steps 2a and 2b are completed, an $O_2$ gas is supplied to the second layer formed on the wafer 200 in the process chamber 201, i.e., on the wafer 200.

At this step, the opening/closing control of the valves 243b, 243d and 243e are performed in the same manner as the opening/closing control of the valves 243a, 243d, and 243e performed at step 1. The flow rate of the $O_2$ gas is adjusted by the MFC 241b, and the flow rate-adjusted $O_2$ gas is supplied into the process chamber 201 through the nozzle 249b and then exhausted through the exhaust pipe 231. At this time, the $O_2$ gas is supplied to the wafer 200.

The supply flow rate of the $O_2$ gas controlled by the MFC 241b is set to fall within a range of, e.g., 100 to 10000 sccm. The internal pressure of the process chamber 201 is set to fall within a range of, e.g., 1 to 4000 Pa, preferably, 1 to 3000 Pa. By setting the internal pressure of the process chamber 201 to such a relatively high pressure, it becomes possible to thermally activate the $O_2$ gas under a non-plasma condition. If the $O_2$ gas is thermally activated and supplied, a relatively more soft reaction can occur, facilitating the formation of a third layer (SiOCN layer) to be described later. A time period during which the $O_2$ gas is supplied to the wafer 200 is set to fall within a range of, e.g., 1 to 120 seconds, preferably, 2 to 60 seconds. Other process conditions may be the same as, for example, those used at step 1.

By supplying the $O_2$ gas to the wafer 200 under the aforementioned conditions and then performing steps 2a and 2b, it is possible to modify (oxidize) at least a portion of the second layer formed on the wafer 200. That is, it is possible to form a Si—O bond in the second layer by adding at least a portion of the O component contained in the $O_2$ gas to the second layer. As the second layer is modified, a silicon oxycarbonitride layer (SiOCN layer) containing Si, O, C, and N is formed as a third layer on the wafer 200. When the third layer is formed, at least a portion of the C component or the N component contained in the second layer may be maintained (retained) in the second layer, without being desorbed from the second layer.

During the formation of the third layer, the Cl contained in the second layer forms a gaseous substance containing at least Cl in the curse of the modification reaction using the $O_2$ gas and the gaseous substance thus formed is discharged from the interior of the process chamber 201. That is, the impurities such as Cl contained in the second layer are extracted or desorbed from the second layer, and are eventually separated from the second layer. Thus, the third layer becomes a layer having a smaller amount of impurities such as Cl than the second layer.

After the third layer is formed, the valve 243b is closed to stop the supply of the $O_2$ gas. Then, the unreacted $O_2$ gas, the $O_2$ gas contributed to the formation of the third layer, or the reaction byproduct, which remains in the process chamber 201, is removed from the interior of the process chamber 201 by the same processing procedures as used at step 1. At this time, similar to step 1, the gas or the like which remains in the process chamber 201 may not be completely removed.

As the oxidizing gas, it may be possible to use not only the $O_2$ gas but also vapor ($H_2O$ gas), a nitrogen monoxide (NO) gas, a nitrous oxide ($N_2O$) gas, a nitrogen dioxide ($NO_2$) gas, a carbon monoxide (CO) gas, a carbon dioxide ($CO_2$) gas, an ozone ($O_3$) gas, and an O-containing gas such as an $H_2$ gas+$O_2$ gas or an $H_2$ gas+an $O_2$ gas.

As the inert gas, it may be possible to use not only the $N_2$ gas but also a rare gas such as, for example, an Ar gas, a He gas, a Ne gas, or a Xe gas.

(Performing Predetermined Number of Times)

A SiOCN film having a predetermined composition and a predetermined thickness may be formed on the wafer 200 by performing the cycle of performing steps 1, 2a, 2b, and 3 at the aforementioned timings one or more times (n times). Preferably, the aforementioned cycle is performed a plurality of times. That is, the aforementioned cycle is preferably repeated a plurality of times until the SiOCN film formed by layering the third layer by setting a thickness of the third layer formed per cycle to be smaller than a desired film thickness has a desired film thickness.

(Purge Step and Atmosphere Returning Step)

After the film forming step is completed, an $N_2$ gas is supplied into the process chamber 201 from each of the gas supply pipes 232d and 232e and then exhausted through the exhaust pipe 231. The $N_2$ gas serves as a purge gas. Thus, the interior of the process chamber 201 is purged and the residual gas or the reaction byproduct remaining in the process chamber 201 is removed from the interior of the process chamber 201 (purge). Thereafter, the internal atmosphere of the process chamber 201 is substituted with an inert gas (inert gas substitution), and the internal pressure of the process chamber 201 returns to a normal pressure (return to an atmospheric pressure).

(Unloading Step)

Thereafter, the seal cap 219 is moved down by the boat elevator 115 to open the lower end of the manifold 209. The processed wafer 200 supported by the boat 217 is unloaded from the lower end of the manifold 209 to the outside of the reaction tube 203 (boat unloading). After the boat 217 is unloaded, the shutter 219s is moved and the lower end opening of the manifold 209 is sealed by the shutter 219s through the O-ring 220c (shutter close). The processed wafer 200 is unloaded to the outside of the reaction tube 203 and then discharged from the boat 217 (wafer discharge).

(4) Effects According to the Present Embodiment

According to the present embodiment, one or more effects set forth below may be achieved.

(a) When the cycle including steps 1, 2a, 2b, and 3 is performed, by setting the supply amount of the $NH_3$ gas to be smaller than the supply amount of the TEA gas, it becomes possible to appropriately increase a concentration of C in the film, while suppressing an excessive amount of N added into the film formed on the wafer 200. That is to say, by setting the supply amount of the $NH_3$ gas that does not serve as a C source but serves only as an N source to be smaller than the supply amount of the TEA gas that serves both as the N source and the C source, it becomes possible to appropriately increase each of the concentration of N and the concentration of C of the film formed on the wafer 200 (adjust them to appropriate values), compared with a case where the supply amount of the $NH_3$ gas is set to be greater than the supply amount of the TEA gas.

The reason is because the reactivity of the $NH_3$ gas is higher than that of the TEA gas. Accordingly, if the supply amount of the $NH_3$ gas is set to be equal or greater than that of the TEA gas in each cycle, the reaction site (adsorption site) of the first layer may be deprived by the $NH_3$ gas, potentially making it difficult to perform the aforementioned action between the first layer and the TEA gas. In addition, the C added into the first layer by the action of the TEA gas may be desorbed from the first layer due to the effects of the NH₃ gas having high reactivity. As a result, N may be excessively added into the film formed on the wafer 200, while the amount of C contained in the film may be reduced. In this case, the dry etching resistance or ashing resistance (oxidation resistance) of the film formed on the wafer 200 may be assured, but the wet etching resistance may be degraded (insufficient) or the permittivity may be excessively increased. In other words, it may be difficult to appropriately maintain the balance of these characteristics in a trade-off relationship.

According to this embodiment, by setting the supply amount of the NH₃ gas having reactivity higher than that of the TEA gas to be smaller than that of the TEA gas in each cycle, it becomes possible to sufficiently assure the reaction site required for reaction between the first layer and the TEA gas. It also becomes possible to suppress the desorption of C from the first layer due to the effects of the NH₃ gas having high reactivity. As a result, it becomes possible to appropriately increase each of the concentration of N and the concentration of C in the film formed on the wafer 200 (to adjust them to appropriate values). As a result, it becomes possible to assure the dry etching resistance and ashing resistance of the film formed on the wafer 200, and to suppress an increase in permittivity, as well as assuring the wet etching resistance. That is to say, it becomes possible to appropriately maintain the balance of these characteristics in a trade-off relationship.

(b) By performing steps 2a and 2 b at the aforementioned timings in each cycle, it becomes possible to more appropriately increase the concentration of C in the film formed on the wafer 200. That is to say, by starting step 2a before step 2b in each cycle, it becomes possible to more appropriately increase the concentration of C in the film formed on the wafer 200, compared with a case where the step 2b starts before step 2a or a case where steps 2a and 2b start simultaneously.

The reason is because, as mentioned above, the reactivity of the NH₃ gas is higher than that of the TEA gas. Accordingly, if step 2b starts before step 2a or if steps 2a and 2b start simultaneously in each cycle, the reaction site of the first layer may be deprived by the NH₃ gas, thus making it difficult to perform the aforementioned reaction between the first layer and the TEA gas. In addition, the C added into the first layer by the action of the TEA gas may be desorbed from the first layer due to the effects of the NH₃ gas having high reactivity. As a result, N may be excessively added to the film formed on the wafer 200, while the amount of C introduced to the film may be reduced. In this case, the dry etching resistance and ashing resistance of the film formed on the wafer 200 may be assured, but the wet etching resistance may be insufficient or the permittivity may be excessively increased as mentioned above.

According to this embodiment, by starting step 2a before step 2b in each cycle, it becomes possible to sufficiently assure the reaction sit required for reaction between the first layer and the TEA gas. It also becomes possible to suppress the desorption of C from the first layer due to the effects of the NH₃ gas having high reactivity. As a result, it becomes possible to appropriately increase each of the concentration of N and the concentration of C in the film formed on the wafer 200. Consequently, it becomes possible to assure the dry etching resistance and ashing resistance of the film formed on the wafer 200, and to suppress an increase in permittivity, as well as assuring the wet etching resistance.

(c) By performing step 2b of supplying the NH₃ gas to the wafer 200, it becomes possible to enhance the uniformity of the wafer in-plane film thickness of the film formed on the wafer 200, compared with a case where step 2b is not performed. This is because, when the NH₃ gas having reactivity higher than that of the TEA gas is used in combination with the TEA gas, it becomes more possible to uniformly modify (nitride) the first layer formed on the wafer 200 over the entire surface, compared with a case where the NH₃ gas is not used and the TEA gas is used alone.

(d) By performing step 2b of supplying the NH₃ gas to the wafer 200, it becomes possible to enhance the productivity of the film forming process, compared with a case where step 2b is not performed. This is because, when the NH₃ gas having reactivity higher than that of the TEA gas is used in combination with the TEA gas, it becomes possible to more effectively modify (nitride) the first layer formed on the wafer 200 within a short time, compared with a case where the NH₃ gas is not used and the TEA gas is used alone.

(e) By performing step 2b of supplying the NH₃ gas to the wafer 200, it becomes possible to reduce the impurities in the film formed on the wafer 200, compared with a case where step 2b is not performed. This is because, when the NH₃ gas having reactivity higher than that of the TEA gas is used in combination with the TEA gas, it becomes possible to more effectively desorb the impurities such as Cl or the like from the first layer formed on the wafer 200, compared with a case where the NH₃ gas is not used and the TEA gas is used alone.

(f) By performing step 2b during a period in which step 2a is performed, it becomes possible to shorten the time required per cycle. As a result, it becomes possible to enhance the productivity of the substrate processing.

(g) By performing step 1, step 2a, and step 3 non-simultaneously, it becomes possible to enhance the step coatability or film thickness controllability of the film formed on the wafer 200, compared with a case where at least any one of the steps is simultaneously performed.

(h) The aforementioned effects may be similarly achieved in a case where a precursor gas other than the HCDS gas is used, in a case where a gas that contains C and N other than the TEA gas is used, in a case where an N-containing gas other than the NH₃ gas is used, or in a case where an O-containing gas other than the O₂ gas is used.

(4) Modifications

The sequence of the film forming process in the present embodiment is not limited to the example illustrated in FIG. 4 but may be changed as in modifications described below.
(Modifications 1 and 2)

In each cycle, step 2a of supplying the TEA gas may start before step 2b of supplying the NH₃ gas, or step 2b may be performed non-simultaneously with step 2a. For example, as in modification 1 illustrated in FIG. 4, step 2b may start after the completion of step 2a in each cycle. Also, for example, as in modification 2 illustrated in FIG. 4, step 2b may start simultaneously with the completion of step 2a in each cycle.

The same effects as those of the basic sequence illustrated in FIG. 4 may be also achieved through such modification. In addition, according to the modification in which step 2b starts after the completion of step 2a, it becomes possible to reliably prevent the reaction site of the first layer from being firstly deprived by the NH₃ gas. As a result, it becomes possible to more appropriately increase the concentration of C in the film formed on the wafer 200, compared with the concentration of C in the film formed in the basic sequence illustrated in FIG. 4.

(Modification 3 to 6)

In each cycle, step 2a of supplying the TEA gas may start before step 2b of supplying the NH$_3$ gas, and each cycle may include a period during which step 2b is performed simultaneously with step 2a. For example, as in modification 3 illustrated in FIG. 4, step 2b may be completed after the completion of step 2a in each cycle. Further, for example, as in modifications 4 to 6 illustrated in FIG. 4, step 2b may be completed before the completion of step 2a in each cycle. Also, modifications 4 to 6 illustrate cases where step b is performed and completed in the late part, in a middle part, or in a whole part of the performing period of step 2a.

The same effects as those of the basic sequence illustrated in FIG. 4 may be also achieved through such modifications. In addition, according to modification 3, it becomes possible to more prevent the reaction site of the first layer from being firstly deprived by the NH$_3$ gas, compared with the basic sequence illustrated in FIG. 4. As a result, it becomes possible to finely adjust the concentration of C in the film formed on the wafer 200 to be higher than the concentration of C in the film formed in the basic sequence illustrated in FIG. 4 and to be appropriately lower than the concentration of C in the film formed in modifications 1 and 2. Also, according to modifications 4 to 6, it becomes possible to finely adjust the concentration of C in the film formed on the wafer 200 to be appropriately lower than the concentration of C in the film formed in the basic sequence illustrated in FIG. 4 or in modification 3. Further, when step 2b is performed during a period in which step 2a is performed, the concentration of C in the film formed on the wafer 200 tends to be lower, compared with a case where step 2b is performed in a middle stage or in the late part of the performing period of step 2a.

(Modification 7)

In each cycle, step 2a of supplying the TEA gas may start simultaneously with step 2b of supplying the NH$_3$ gas. In this case, as in modification 7 illustrated in FIG. 4, step 2b may be completed before the completion of step 2a in each cycle.

The same effects as those of the basic sequence illustrated in FIG. 4 may be also achieved through this modification. In addition, according to this modification, it becomes possible to finely adjust the concentration of C in the film formed on the wafer 200 to be lower than the concentration of C in the film formed in the basic sequence illustrated in FIG. 4 or in modifications 1 to 6.

(Modification 8)

In each cycle, step 2b of supplying the NH$_3$ gas may start before step 2a of supplying the TEA gas, and each cycle may include a period during which step 2b is performed simultaneously with step 2a. In this case, as in modification 8 illustrated in FIG. 4, step 2b may be completed before the completion of step 2a in each cycle.

The same effects as those of the basic sequence illustrated in FIG. 4 may be also achieved through this modification, by setting the supply amount of the NH$_3$ gas to be sufficiently smaller than that of the TEA gas. In addition, according to this modification, it becomes easy to finely adjust the concentration of C in the film formed on the wafer 200 to be lower than the concentration of C in the film formed in the basic sequence illustrated in FIG. 4 or in modifications 1 to 7.

(Modifications 9 and 10)

In each cycle, step 2b of supplying the NH$_3$ gas may start before step 2a of supplying the TEA gas, or step 2b may be performed non-simultaneously with step 2a. For example, as in modification 9 illustrated in FIG. 4, step 2b may be completed after the start of step 2a in each cycle. Also, for example, as in modification 10 illustrated in FIG. 4, step 2b may be completed before the start of step 2a in each cycle.

The same effects as those of the basic sequence illustrated in FIG. 4 may be also achieved through this modification, by setting the supply amount of the NH$_3$ gas to be sufficiently smaller than that of the TEA gas. Also, according to this modification, it becomes possible to finely adjust the concentration of C in the film formed on the wafer 200 to be lower than the concentration of C in the film formed in the basic sequence illustrated in FIG. 4 or in modifications 1 to 8.

(Modifications 11 to 14)

In each cycle, the supply time of the NH$_3$ gas with respect to the wafer 200 may be set not to be shorter than that of the TEA gas with respect to the wafer 200 and the supply amount of the NH$_3$ gas with respect to the wafer 200 may be set to be smaller than that of the TEA gas with respect to the wafer 200.

Figure 5:
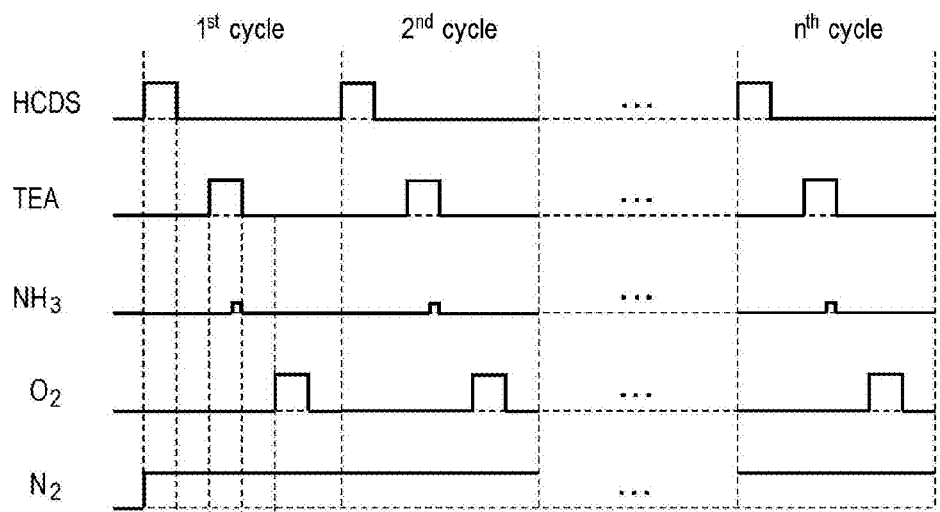
FIG. 5 is a diagram illustrating a timing of the gas supply in a film formation sequence according to one embodiment of the present disclosure, and exemplary modifications thereof.

For example, as in modification 11 illustrated in FIG. 5, step 2b may start before step 2a and may be completed after the completion of step 2a in each cycle. Also, for example, as modification 12 illustrated in FIG. 5, step 2b may start simultaneously with step 2a and may be completed after the completion of step 2a in each cycle. Also, for example, as in modification 13 illustrated in FIG. 5, step 2b may start before step 2a and may be completed simultaneously with the completion of step 2a in each cycle. Also, for example, as in modification 14 illustrated in FIG. 5, step 2b may start simultaneously with step 2a and may be completed simultaneously with the completion of step 2a in each cycle.

In any modification, the supply flow rate of the NH$_3$ gas with respect to the wafer 200 is set to be sufficiently smaller than that of the TEA gas with respect to the wafer 200. Thus, in each cycle, the supply amount of the NH$_3$ gas with respect to the wafer 200 can be set to be sufficiently smaller than that of the TEA gas with respect to the wafer 200, thereby achieving the same effects as those of the basic sequence illustrated in FIG. 4.

(Modifications 15 to 20)

At step 2b, the supply of the NH$_3$ gas to the wafer 200 may be performed intermittently rather than continuously. For example, as illustrated in modifications 15 to 20, at step 2b, the supply of the NH$_3$ to the wafer 200 may be performed a plurality of times simultaneously or non-simultaneously with the supply of the TEA gas to the wafer 200.

In any modification, in each cycle, by setting the supply time of the NH$_3$ gas with respect to the wafer 200 to be shorter than that of the TEA gas with respect to the wafer 200, or by setting the supply flow rate of the NH$_3$ gas with respect to the wafer 200 to be smaller than that of the TEA gas with respect to the wafer 200, it is possible to set the supply flow rate of the NH$_3$ gas with respect to the wafer 200 to be smaller than that of the TEA gas with respect to the wafer 200. Thus, the same effects as those of the basic sequence illustrated in FIG. 4 may be also achieved.

Other Embodiments

While the embodiment of the present disclosure has been described above, the present disclosure is not limited to the aforementioned embodiments but may be variously modified without departing the spirit of the present disclosure.

For example, in the aforementioned embodiments, there has been described an example in which the reactant is supplied after the precursor is supplied. However, the present disclosure is not limited thereto, but the supply orders of the precursor and the reactant may be reversed. That is, the precursor may be supplied after the reactant is supplied. It becomes possible to change a film quality or a composition ratio of a formed film by changing the supply order.

Further, the present disclosure may be appropriately applied to a case where an oxycarbonitride film containing a metal element such as titanium (Ti), zirconium (Zr), hafnium (Hf), taltanum (Ta), niobium (Nb), molybdenum (Mo), tungsten (W), yttrium (Y), strontium (Sr), or aluminum (Al), i.e., a metal oxycarbonitride film, is formed on the wafer 200. That is, the present disclosure may be appropriately applied to a case where, for example, a TiOCN film, a ZrOCN film, an HfOCN film, a TaOCN film, an NbOCN film, an MoOCN film, a WOCN film, a YOCN film, an SrOCN film, or an AlOCN film is formed on the wafer 200.

For example, the present disclosure may be appropriately applied to a case where a metal oxycarbonitride film such as a TiOCN film or an HfOCN film is formed on the wafer 200 by the film forming sequence illustrated below, using a metal compound containing a metal element or Cl such as titanium tetrachloride (TiCl4) or hafnium tetrachloride (HfCl4), as the precursor.

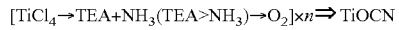

The processing procedures and processing conditions at this time may be the same as those of the aforementioned embodiments or modifications. Also in these cases, the same effects as those of the aforementioned embodiments or modifications may be achieved. That is, the present disclosure may be appropriately applied to a case where a semiconductor oxycarbonitride film or a metal oxycarbonitride film is formed.

Preferably, the recipes used in the substrate processing (programs in which the processing procedures, processing conditions, or the like are written) may be individually prepared according to the processing contents (a film type of a film to be formed, a composition ratio, a film quality, a film thickness, processing procedures, processing conditions, and the like), and stored in advance in the memory device 121c via an electrical communication line or the external memory device 123. In addition, at the start of the substrate processing, preferably, the CPU 121a appropriately selects a suitable recipe from among the plurality of recipes stored in the memory device 121c according to the processing contents. This enables a single substrate processing apparatus to form films having different film types, composition ratios, film qualities, and film thicknesses with high reproducibility. Further, this can reduce an operator's operation burden (a burden borne by an operator when inputting the processing procedures or processing conditions, or the like), thereby avoiding a manipulation error and quickly starting the substrate processing.

The recipes described above are not limited to newly prepared ones but may be prepared by, for example, modifying the existing recipes already installed in the substrate processing apparatus. In the case of modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiments, there have been described examples in which films are formed using a batch-type substrate processing apparatus capable of processing a plurality of substrates at a time. The present disclosure is not limited to the aforementioned embodiments but may be also appropriately applied to, for example, a case where films are formed using a single-wafer-type substrate processing apparatus capable of processing one or several substrates at a time. In addition, in the aforementioned embodiments, there has been described an example in which films are formed using a substrate processing apparatus having a hot-wall-type processing furnace. The present disclosure is not limited to the aforementioned embodiments but may be also appropriately applied to a case where films are formed using a substrate processing apparatus having a cold-wall-type processing furnace. Also in these cases, the processing procedures and processing conditions may be the same as, for example, those of the aforementioned embodiments.

Figure 9:
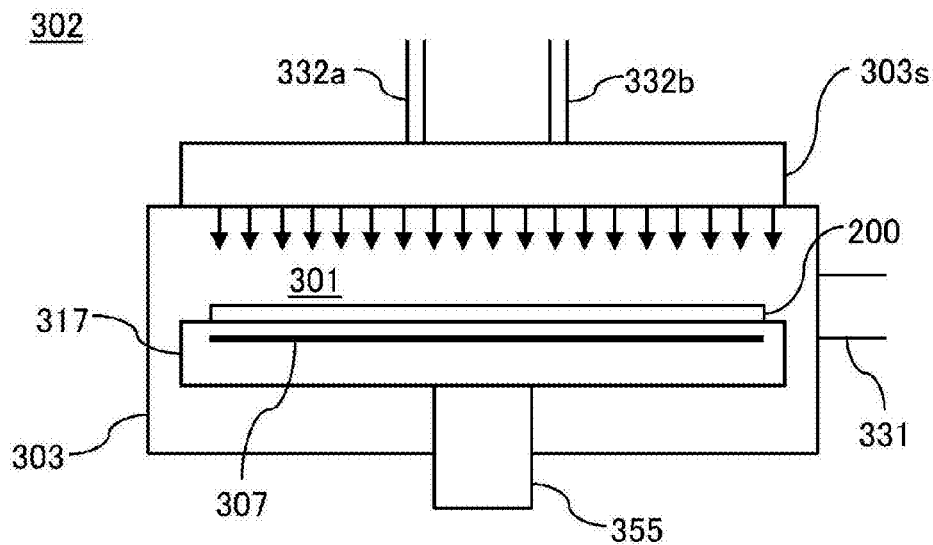
FIG. 9 is a schematic diagram of a processing furnace of a substrate treating apparatus applicably used in another embodiment of the present disclosure, where the processing furnace part is illustrated in a longitudinal cross-sectional view.

For example, the present disclosure may be also appropriately applied to a case where films are formed using a substrate processing apparatus having a processing furnace 302 illustrated in FIG. 9. The processing furnace 302 includes a process vessel 303 forming a process chamber 301, a shower head 303s serving as a gas supply part for supplying a gas in the form of a shower into the process chamber 301, a support table 317 configured to support one or several wafers 200 in a horizontal posture, a rotary shaft 355 configured to support the support table 317 from below, and a heater 307 installed in the support table 317. An inlet (gas introduction port) of the shower head 303s is connected with gas supply ports 332a and 332b. The gas supply port 332a is connected with a supply system like the precursor supply system of the aforementioned embodiments. The gas supply port 332b is connected with a gas supply system like the first to third reactant supply systems of the aforementioned embodiments. A gas distribution plate for supplying a gas in the form of a shower into the process chamber 301 is installed in an outlet (gas discharging port) of the shower head 303s. The shower head 303s is installed at a position facing the surface of the wafer 200 loaded into the process chamber 301. An exhaust port 331 for exhausting the interior of the process chamber 301 is installed in the process vessel 303. The exhaust port 331 is connected with an exhaust system like the exhaust system of the aforementioned embodiments.

Figure 10:
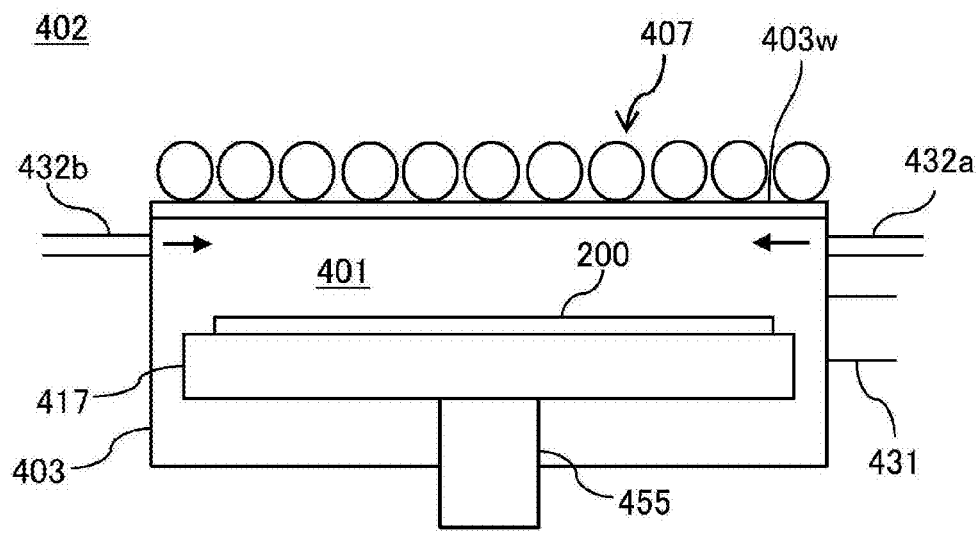
FIG. 10 is a schematic diagram of a processing furnace of a substrate treating apparatus applicably used in another embodiment of the present disclosure, where the processing furnace part is illustrated in a longitudinal cross-sectional view.

In addition, for example, the present disclosure may be also appropriately applied to a case where films are formed using a substrate processing apparatus having a processing furnace 402 illustrated in FIG. 10. The processing furnace 402 includes a process vessel 403 forming a process chamber 401, a support table 417 configured to support one or several wafers 200 in a horizontal posture, a rotary shaft 455 configured to support the support table 417 from below, a lamp heater 407 configured to irradiate light toward the wafers 200 in the process vessel 403, and a quartz window 403w configured to allow the light irradiated from the lamp heater 407 to transmit therethrough. The process vessel 403 is connected with gas supply ports 432a and 432b. The gas supply port 432a is connected with a supply system like the precursor supply system of the aforementioned embodiments. The gas supply port 432b is connected with a supply system like the first to third reactant supply systems of the aforementioned embodiments. The gas supply ports 432a and 432b are respectively installed on sides of the end portions of the wafer 200 loaded into the process chamber 301, namely, at positions that do not face the surface of the wafer 200 loaded into the process chamber 301. An exhaust port 431 for exhausting the interior of the process chamber

401 is installed in the process vessel 403. The exhaust port 431 is connected with an exhaust system like the exhaust system in the aforementioned embodiments.

The first substrate processing part for performing the film forming process or the second substrate processing part for performing the etching process may not be limited to a case where each of them is configured as an independent device (stand-alone type device) group, but may be configured as a single device (cluster type device) mounted on the same platform.

Even when these substrate processing apparatuses are used, the film forming process may be performed under the same processing procedures and processing conditions as those of the aforementioned embodiments or modifications, and the same effects as those of the aforementioned embodiments or modifications may be achieved.

Also, the embodiment and modifications described above may be appropriately combined with each other to be used. In this case, the processing procedures and processing conditions may be the same as, for example, those of the aforementioned embodiments.

Examples

The experiment results supporting the effects achieved in the aforementioned embodiments will now be described.

SiOCN films were formed as samples 1 to 4 on a wafer by the basic sequence illustrated in FIG. 4 using the substrate treating apparatus of the aforementioned embodiments. An HCDS gas was used as a precursor, a TEA gas was used as a first reactant, an $NH_3$ gas was used as a second reactant, and an $O_2$ gas was used as a third reactant. The supply time of the HCDS gas, the TEA gas, and the $O_2$ gas was set to fall within a range of 100 to 20 seconds. The supply time of the $NH_3$ gas was set to 0, 1, 3, and 5 seconds in order of samples 1 to 4. The supply time of the $NH_3$ gas is 0 indicates a case (reference example) where a step of supplying the $NH_3$ gas to the wafer was not performed. The temperature of the wafer was set to fall within a range of 600 to 650 degrees C. Other processing conditions were set to fall within the range of as those described in the aforementioned embodiments.

Then, an average film thickness, a film thickness uniformity (hereinafter, also referred to as "WiW"), a refractive index (RI), permittivity, an XPS composition ratio, an etching amount after $O_2$ ashing, and the like in the surface of the wafer of each sample were measured, respectively.

WiW (%) is a value defined as {(a maximum value of film thickness in the wafer surface—a minimum value of film thickness in the wafer surface)/(2×an average value of film thickness in the wafer surface)}×100, and indicates that, as the value is reduced, a film thickness in the wafer surface is uniform. In this evaluation, a film thickness of the SiOCN film was measured at 49 points of the wafer surface, and an average film thickness and WiW were calculated based on the measurement values.

The evaluation results of a film thickness map, an average film thickness (Å), WiW (%), a refractive index map, a refractive index, and permittivity of the SiOCN films of samples 1 to 4 are respectively illustrated in FIG. 6.

From FIG. 6, it can be seen that WiW of samples 2 to 4 are smaller than that of sample 1. That is, it can be seen that it is possible to enhance the wafer in-plane film thickness uniformity of the film formed on the wafer by performing the step of supplying the $NH_3$ gas to the wafer 200, compared with a case where the step is not performed. In addition, the WiW of sample 2 is smaller than that of sample 3 and the WiW of sample 4 is smaller than that of sample 3.

That is to say, it can be seen that, as the supply time of $NH_3$ gas with respect to the wafer 200 is longer, the wafer in-plane film thickness uniformity of the film formed on the wafer is enhanced.

Moreover, from FIG. 6, it can be seen that the average film thicknesses, refractive indices, and permittivities of samples 1 to 4 are equal. That is to say, by appropriately controlling the supply amount or supply timing of the $NH_3$ gas as in the basic sequence illustrated in FIG. 4, it is possible to suppress the excessive addition of N to the SiOCN film, thereby avoiding influence on the film quality such as an increase in permittivity.

Figure 7:
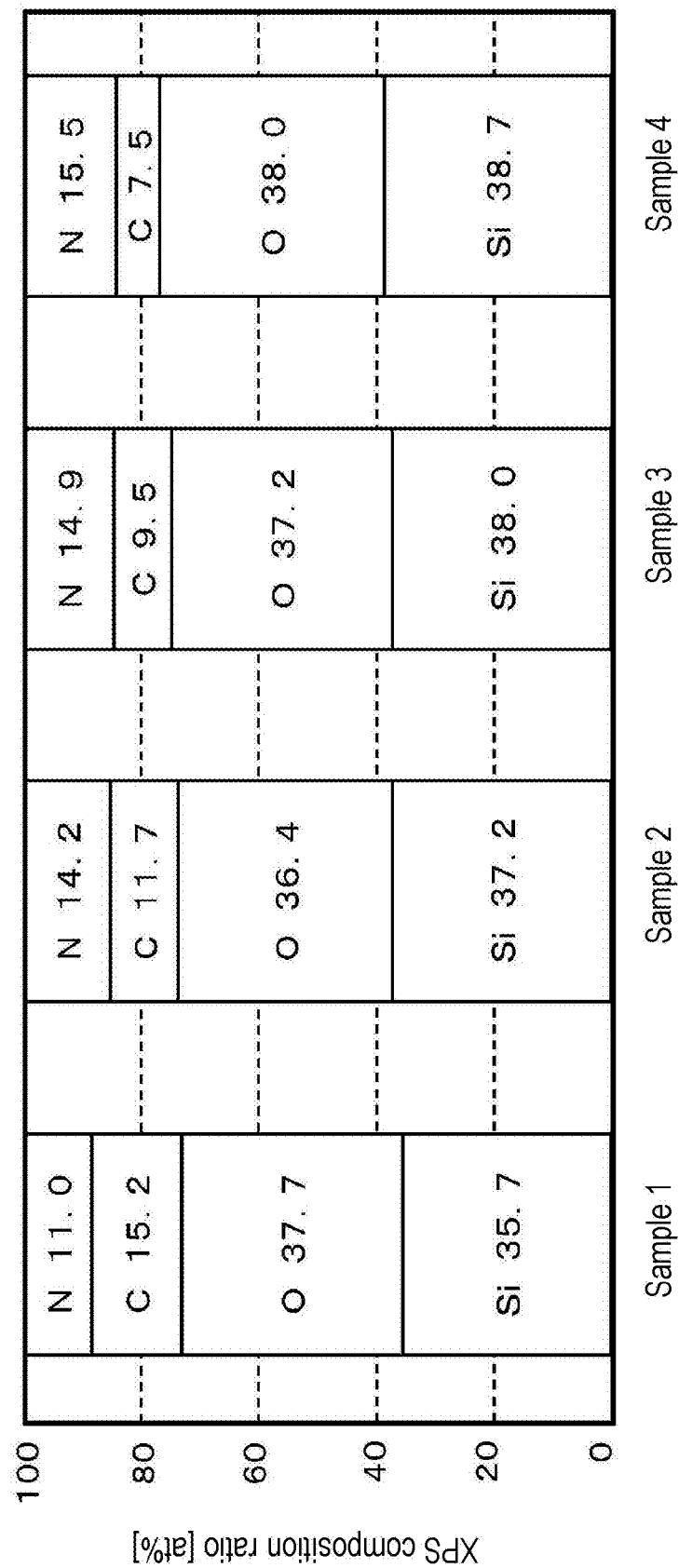
FIG. 7 is a diagram illustrating the evaluation results of a composition ratio of a film formed on a substrate.

The XPS evaluation results of the SiOCN films of samples 1 to 4 are illustrated in FIG. 7. The vertical axis of FIG. 7 represents the concentrations [at %] of Si, O, C, and N in the films measured by XPS. The horizontal axis of FIG. 7 represents samples 1 to 4 in order.

From FIG. 7, it can be seen that the excessive addition of N to the SiOCN films of samples 2 to 4 can be avoided and a sufficient amount of C was added to the films even though the step of supplying the $NH_3$ gas to the wafer is performed at the time of manufacturing.

In addition, from FIG. 7, it can be seen that the ratio of C and N in the film can be minutely adjusted by adjusting the supply time of the $NH_3$ gas. For example, in sample 2, it can be seen that the ratio of the concentration of C/concentration of N in the film can be increased (C/N=11.7/14.2=0.8) by shortening the supply time of the $NH_3$ gas. Further, for example, in sample 4, it can be seen that the ratio of the concentration of C/concentration of N in the film can be decreased (C/N=7.5/15.5=0.5) by increasing the supply time of the $NH_3$ gas.

Moreover, from FIG. 7, it can be seen that the ratios of the concentration of Si/concentration of O in the SiOCN films of samples 2 to 4 are in the same level as the ratio of the concentration of Si/concentration of O in the SiOCN film of sample 1 in which the step of supplying the $NH_3$ gas to the wafer was not performed during its manufacturing process. That is to say, it can be seen that, even though the step of supplying the $NH_3$ gas to the wafer was performed during the film forming process, the ratio of the concentration of C/concentration of N of the film can be freely adjusted by appropriately controlling the supply amount or supply timing of the $NH_3$ gas like the basic sequence illustrated in FIG. 4, while keeping the ratio of the concentration of Si/concentration of O in the SiOCN film within a predetermined range.

In addition, according to the evaluations, it can be confirmed that the concentration of Cl in the SiOCN films of samples 2 to 4 is lower than the concentration of Cl in the SiOCN film of sample 1. That is to say, it can be confirmed that, by performing the step of supplying the $NH_3$ gas to the wafer, it is possible to reduce the impurities in the film formed on the wafer, compared with a case where the step is not performed. Moreover, it can be also confirmed that the concentration of Cl in the SiOCN film of sample 3 was lower than that of sample 2 and the concentration of Cl in the SiOCN film of sample 4 was lower than that of sample 3. That is to say, it can be confirmed that it is possible to further reduce the impurities in the film formed on the wafer by increasing the supply amount of the $NH_3$ gas with respect to the wafer.

Figure 8:
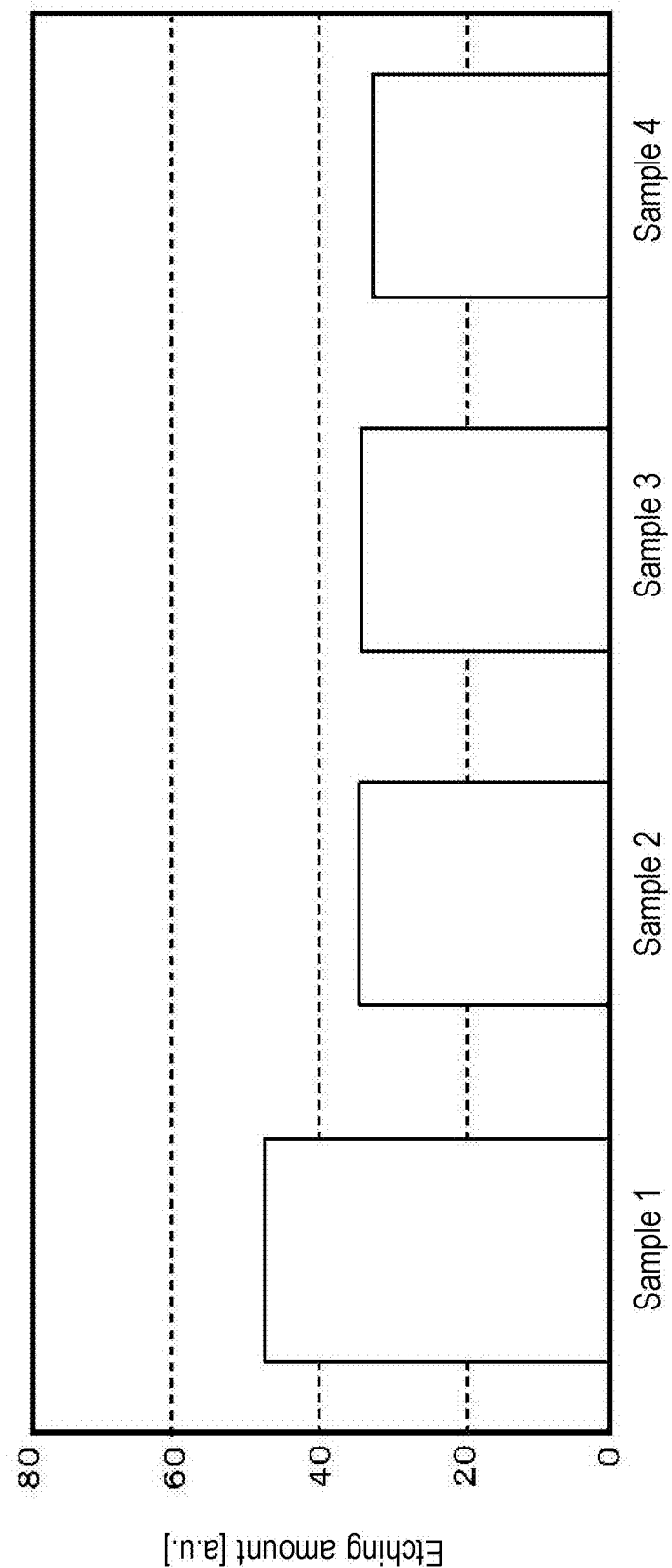
FIG. 8 is a diagram illustrating the evaluation results of ashing resistance of a film formed on a substrate.

The evaluation results regarding the $O_2$ ashing resistance of the SiOCN films of samples 1 to 4 are illustrated in FIG. 8. The vertical axis of FIG. 8 represents an etching amount (a.u.) of the SiOCN film when the SiOCN film was etched using a hydrogen fluoride (HF)-containing solution having a concentration of 1% after a plasma-excited $O_2$ gas is supplied to the SiOCN film for a predetermined period of time. The horizontal axis of FIG. 8 represents samples 1 to 4 in order.

From FIG. 8, it can be seen that the etching amount of the SiOCN films of samples 1 to 4 is smaller than that of the SiOCN film of sample 1, namely, the wet etching resistance of the SiOCN films of samples 2 to 4 are higher. It is considered that this is because the ashing resistance of the SiOCN films of samples 2 to 4 is higher than that of the SiOCN film of sample 1 and the damage to the SiOCN films of samples 2 to 4 when the plasma-excited $O_2$ gas was supplied is less than that to the SiOCN film of sample 1. It is considered that the reason why the ashing resistance of the SiOCN films of samples 2 to 4 is higher than that of the SiOCN film of sample 1 is because the concentration of N of the films in the SiOCN films of samples 2 to 4 is higher than that of the SiOCN film of sample 1 (the ratio of the concentration of N/the concentration of C is large). Since the C contained in the film is easy to oxidize, the C tends to be desorbed from the film when the plasma-excited $O_2$ gas is supplied. In contrast, the N contained in the film is difficult to oxidize, and the N acts to suppress the desorption of C from the film when the plasma-excited $O_2$ gas is supplied. Since the concentration of N of the SiOCN films of samples 2 to 4 is higher than that of the SiOCN film of sample 1, it is considered that, when the plasma-excited $O_2$ gas is supplied, the desorption of C from the film is suppressed, and as a result, the resistance to the wet etching can be maintained, compared with the SiOCN film of sample 1.

According to the present disclosure in some embodiments, it is possible to enhance the controllability of a composition ratio of a film formed on a substrate.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device comprising:
forming a film containing a predetermined element, oxygen, carbon and nitrogen on a substrate in a process chamber by performing a cycle a predetermined number of times, the cycle including non-simultaneously performing:
supplying a precursor containing the predetermined element to the substrate in the process chamber to form a first layer containing the predetermined element;
discharging the precursor from an interior of the process chamber;
supplying a first reactant containing nitrogen and carbon but not containing the predetermined element, and a second reactant containing nitrogen to the substrate in the process chamber to modify the first layer and form a second layer containing the predetermined element, carbon and nitrogen;
discharging the first reactant and the second reactant from the interior of the process chamber;
supplying a third reactant containing oxygen to the substrate in the process chamber to modify the second layer and form a third layer containing the predetermined element, oxygen, carbon and nitrogen; and
discharging the third reactant from the interior of the process chamber,
wherein the act of supplying the first reactant and the second reactant includes a period during which the second reactant and the first reactant are supplied simultaneously, and
wherein in the act of supplying the first reactant and the second reactant, a supply amount of the second reactant is set to be smaller than a supply amount of the first reactant.

2. The method of claim 1, wherein in the act of supplying the first reactant and the second reactant, a supply time of the second reactant is set to be shorter than a supply time of the first reactant.

3. The method of claim 1, wherein in the act of supplying the first reactant and the second reactant, a supply flow rate of the second reactant is set to be smaller than a supply flow rate of the first reactant.

4. The method of claim 1, wherein in the act of supplying the first reactant and the second reactant, the supply of the first reactant starts prior to a start of the supply of the second reactant.

5. The method of claim 1, wherein in the act of supplying the first reactant and the second reactant, the supply of the second reactant is completed simultaneously with completion of the supply of the first reactant.

6. The method of claim 1, wherein in the act of supplying the first reactant and the second reactant, the supply of the second reactant is completed before completion of the supply of the first reactant.

7. The method of claim 1, wherein in the act of supplying the first reactant and the second reactant, the supply of the second reactant is completed after completion of the supply of the first reactant.

8. The method of claim 1, wherein the act of supplying the first reactant and the second reactant includes a period during which the second reactant and the first reactant are supplied non-simultaneously.

9. The method of claim 1, wherein in the act of supplying the first reactant and the second reactant, a supply time of the second reactant is set to fall within a range of $\frac{1}{120}$ to $\frac{1}{2}$ of a supply time of the first reactant.

10. The method of claim 1, wherein in the act of supplying the first reactant and the second reactant, a supply flow rate of the second reactant is set to fall within a range of $\frac{1}{100}$ to $\frac{1}{2}$ of a supply flow rate of the first reactant.

11. The method of claim 1, wherein in the act of supplying the first reactant and the second reactant, a supply time of the second reactant is set to be smaller than that of the first reactant while a supply flow rate of the second reactant is set to be smaller than that of the first reactant.

12. The method of claim 1, wherein in the act of supplying the first reactant and the second reactant, a partial pressure of the second reactant is set to be smaller than that of the first reactant.

13. The method of claim 1, wherein in the act of supplying the first reactant and the second reactant, a partial pressure of the second reactant is set to fall within a range of $\frac{1}{100}$ to $\frac{1}{2}$ of a partial pressure of the first reactant.

14. The method of claim 1, wherein in the act of supplying the first reactant and the second reactant, the supply of the first reactant starts prior to a start of the supply of the second reactant; the supply of the second reactant then starts in a state where the supply of the first reactant is maintained; and the supply of the second reactant is then simultaneously completed with completion of the supply of the first reactant.

15. The method of claim 1, wherein concentration of nitrogen in the film is higher than concentration of carbon in the film and is lower than concentration of the predetermined element in the film and concentration of oxygen in the film.

16. The method of claim 1, wherein the first reactant consists of three elements including carbon, nitrogen and hydrogen, and the second reactant consists of two elements including nitrogen and hydrogen.

17. The method of claim 1, wherein the first reactant includes amine or an organic hydrazine compound while the second reactant includes a hydrogen nitride-based gas.

18. The method of claim 1, wherein the first reactant includes amine or an organic hydrazine compound in which the number of carbon in one molecule is larger than that of nitrogen in one molecule, and the second reactant includes a hydrogen nitride-based gas.

19. The method of claim 1, wherein the first reactant includes amine or an organic hydrazine compound in which the number of carbon-containing ligands in one molecule is multiple, and the second reactant includes a hydrogen nitride-based gas.

20. A substrate processing apparatus comprising:
a process chamber configured to accommodate a substrate;
a precursor supply system configured to supply a precursor containing a predetermined element to the substrate in the process chamber;
a first reactant supply system configured to supply a first reactant containing nitrogen and carbon but not containing the predetermined element to the substrate in the process chamber;
a second reactant supply system configured to supply a second reactant containing nitrogen to the substrate in the process chamber;
a third reactant supply system configured to supply a third reactant containing oxygen to the substrate in the process chamber;
an exhaust system configured to exhaust an interior of the process chamber; and
a control part configured to control the precursor supply system, the first reactant supply system, the second reactant supply system, the third reactant supply system and the exhaust system to form a film containing the predetermined element, oxygen, carbon and nitrogen on the substrate in the process chamber by performing a cycle a predetermined number of times, the cycle including non-simultaneously performing:
supplying the precursor to the substrate in the process chamber to form a first layer containing the predetermined element;
discharging the precursor from the interior of the process chamber;
supplying the first reactant and the second reactant to the substrate in the process chamber to modify the first layer and form a second layer containing the predetermined element, carbon and nitrogen;
discharging the first reactant and the second reactant from the interior of the process chamber;
supplying a third reactant to the substrate in the process chamber to modify the second layer and form a third layer containing the predetermined element, oxygen, carbon and nitrogen; and
discharging the third reactant from the interior of the process chamber,
wherein the act of supplying the first reactant and the second reactant includes a period during which the second reactant and the first reactant are supplied simultaneously, and
wherein in the act of supplying the first reactant and the second reactant, a supply amount of the second reactant is set to be smaller than a supply amount of the first reactant.

21. A non-transitory computer-readable recording medium storing a program that causes a computer to perform a process of forming a film containing a predetermined element, oxygen, carbon and nitrogen on a substrate in a process chamber by performing a cycle a predetermined number of times, the cycle including non-simultaneously performing:
supplying a precursor containing the predetermined element to the substrate in the process chamber to form a first layer containing the predetermined element;
discharging the precursor from an interior of the process chamber;
supplying a first reactant containing nitrogen and carbon but not containing the predetermined element, and a second reactant containing nitrogen to the substrate in the process chamber to modify the first layer and form a second layer containing the predetermined element, carbon and nitrogen;
discharging the first reactant and the second reactant from the interior of the process chamber;
supplying a third reactant containing oxygen to the substrate in the process chamber to modify the second layer and form a third layer containing the predetermined element, oxygen, carbon and nitrogen; and
discharging the third reactant from the interior of the process chamber,
wherein the act of supplying the first reactant and the second reactant includes a period during which the second reactant and the first reactant are supplied simultaneously, and
wherein in the act of supplying the first reactant and the second reactant, a supply amount of the second reactant is set to be smaller than a supply amount of the first reactant.

* * * * *